US012772794B2

(12) United States Patent
Kanao et al.

(10) Patent No.: US 12,772,794 B2
(45) Date of Patent: Oct. 20, 2026

(54) MANUFACTURING METHOD OF SEMICONDUCTOR DEVICE, METHOD OF TESTING THE SEMICONDUCTOR DEVICE AND WAFER HOLDING MEMBER

(71) Applicant: RENESAS ELECTRONICS CORPORATION, Tokyo (JP)

(72) Inventors: Tsuyoshi Kanao, Tokyo (JP); Koji Ogata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 676 days.

(21) Appl. No.: 18/191,505

(22) Filed: Mar. 28, 2023

(65) Prior Publication Data

US 2023/0411200 A1 Dec. 21, 2023

(30) Foreign Application Priority Data

Jun. 20, 2022 (JP) ................................. 2022-099170

(51) Int. Cl.
*H10P 72/70* (2026.01)
*H10P 52/00* (2026.01)
*H10P 74/20* (2026.01)

(52) U.S. Cl.
CPC .......... *H10P 72/7402* (2026.01); *H10P 52/00* (2026.01); *H10P 74/203* (2026.01); *H10P 72/7416* (2026.01); *H10P 72/7422* (2026.01)

(58) Field of Classification Search
None
See application file for complete search history.

(56) References Cited

U.S. PATENT DOCUMENTS 5,191,218 A * 3/1993 Mori ........................ G03F 7/707 269/21
10,741,504 B2 8/2020 Yoshida
(Continued)

FOREIGN PATENT DOCUMENTS

JP 2007258444 A * 10/2007
JP 2009206417 A * 9/2009
(Continued)

OTHER PUBLICATIONS

Machine translation of JP 2007258444 (Year: 2007).*
Machine translation of JP 2009246199 (Year: 2009).*

*Primary Examiner* — Erik T. K. Peterson
(74) *Attorney, Agent, or Firm* — Rimon P.C.

(57) ABSTRACT

A method of manufacturing a semiconductor device includes: a grind step of forming a small thickness portion and a large thickness portion surrounding the small thickness portion in plan view by grinding a back surface of a semiconductor wafer; a preparation step of preparing a wafer holding member including a wafer placement surface and a back surface opposite to the wafer placement surface and having a larger thickness than a difference between a thickness of the large thickness portion and a thickness of the small thickness portion; and a placement step of placing the semiconductor wafer on the wafer holding member so that the small thickness portion of the semiconductor wafer and the wafer placement surface of the wafer holding member are in contact with each other on the back surface side of the semiconductor wafer.

11 Claims, 19 Drawing Sheets

(56) References Cited

U.S. PATENT DOCUMENTS

| | | | | |
|---|---|---|---|---|
| 2001/0026486 | A1* | 10/2001 | Ogawa | H10P 74/232 365/201 |
| 2001/0026949 | A1* | 10/2001 | Ogawa | H10P 74/23 324/759.02 |
| 2004/0161865 | A1* | 8/2004 | Yu | H10P 74/273 257/E21.526 |
| 2008/0064184 | A1* | 3/2008 | Lackner | H10P 72/70 438/459 |
| 2008/0242052 | A1* | 10/2008 | Feng | H10P 52/00 438/459 |
| 2010/0013169 | A1* | 1/2010 | Monteen | H10P 72/78 279/3 |
| 2010/0261309 | A1* | 10/2010 | Tateishi | H10W 74/01 438/107 |
| 2010/0267175 | A1* | 10/2010 | Amada | H10D 12/441 257/E21.531 |
| 2012/0064696 | A1* | 3/2012 | Hirosawa | H10P 72/0428 257/E21.599 |
| 2012/0090763 | A1* | 4/2012 | Okuno | H10P 72/0442 156/154 |
| 2015/0145547 | A1* | 5/2015 | Yano | G01R 1/0425 269/21 |
| 2015/0332944 | A1* | 11/2015 | Landesberger | H10P 72/0421 29/559 |
| 2016/0163579 | A1* | 6/2016 | Nakamura | H10P 72/74 428/189 |
| 2018/0040522 | A1* | 2/2018 | Seddon | H10P 54/00 |
| 2018/0190552 | A1* | 7/2018 | Seddon | H10P 74/273 |
| 2020/0051877 | A1* | 2/2020 | Seddon | H10P 72/7402 |
| 2020/0051878 | A1* | 2/2020 | Seddon | H10P 72/7402 |
| 2020/0381319 | A1* | 12/2020 | Tang | H10P 72/78 |
| 2021/0028051 | A1* | 1/2021 | Noma | H10P 72/7611 |
| 2021/0134619 | A1* | 5/2021 | Sekiya | H10P 72/0428 |
| 2022/0115250 | A1* | 4/2022 | Saito | H10P 72/0428 |
| 2022/0384237 | A1* | 12/2022 | Saito | H10P 72/0428 |

FOREIGN PATENT DOCUMENTS

| | | | | |
|---|---|---|---|---|
| JP | 2009246199 | A * | 10/2009 | |
| JP | 2018-113307 | A | 7/2018 | |
| WO | WO-2012043349 | A1 * | 4/2012 | H10P 72/78 |
| WO | WO-2016113009 | A1 * | 7/2016 | H10P 72/7611 |

* cited by examiner

POG

MANUFACTURING METHOD OF SEMICONDUCTOR DEVICE, METHOD OF TESTING THE SEMICONDUCTOR DEVICE AND WAFER HOLDING MEMBER

CROSS-REFERENCE TO RELATED APPLICATION

The disclosure of Japanese Patent Application No. 2022-099170 filed on Jun. 20, 2022, including the specification, drawings and abstract is incorporated herein by reference in its entirety.

BACKGROUND

The invention of the present disclosure relates to a method of manufacturing a semiconductor device, a method of testing the semiconductor device, and a wafer holding member.

There is disclosed a technique listed below.

[Patent Document 1] Japanese Unexamined Patent Application Publication No. 2018-113307

In grinding a back surface of a semiconductor wafer, a technique (also referred to as TAIKO process below) of thinning the semiconductor wafer by leaving an outer periphery of the semiconductor wafer and grinding only its inside has been known. In Japanese Unexamined Patent Application Publication No. 2018-113307, a technique capable of improving the manufacturing yield of the semiconductor device even in usage of the TAIKO process is proposed.

SUMMARY

A fully-automated prober cannot handle the semiconductor wafer thinned by the TAIKO process, and therefore, is under circumstances in which the semiconductor wafer cannot be measured by a tester including a dedicated prober to the small thickness specification. In other words, since the thinned wafer cannot be set in a wafer cassette case, the tester including the fully-automated prober cannot be used. Also, the semiconductor wafer thinned by the TAIKO process needs a dedicated loading mechanism and a dedicated stage.

An objective of the invention of the present disclosure is to provide a technique for a wafer holding member capable of having almost the same shape as that of a related-art semiconductor wafer even when being attached to the thinned semiconductor wafer.

Other object and novel characteristics will be apparent from the description of the present specification and the accompanying drawings.

The outline of the typical aspects of the invention of the present disclosure will be briefly described as follows.

According to an embodiment, a method of manufacturing a semiconductor device includes: a grind step of forming a small thickness portion and a large thickness portion surrounding the small thickness portion in a plan view by grinding a first back surface of a semiconductor wafer including a front surface and the first back surface opposite to the front surface; a preparation step of preparing a wafer holding member including a wafer placement surface and a second back surface opposite to the wafer placement surface and having a larger thickness than a difference between a thickness of the large thickness portion and a thickness of the small thickness portion; a placement step of placing the semiconductor wafer on the wafer holding member so that the small thickness portion of the semiconductor wafer and the wafer placement surface of the wafer holding member are in contact with each other on the first back surface side of the semiconductor wafer; and a movement step of moving the semiconductor wafer in a state in which the semiconductor wafer is held on the wafer holding member.

According to the method of manufacturing the semiconductor device, a state of attachment of the wafer holding member to the thinned semiconductor wafer is allowed to have almost the same shape as that of a related-art semiconductor wafer, and therefore, this state can be handled as similar to the related art in the movement step of the semiconductor wafer.

BRIEF DESCRIPTIONS OF THE DRAWINGS

DETAILED DESCRIPTION

Hereinafter, embodiments and examples will be described with reference to the accompanying drawings. Note that the same components are denoted by the same reference signs in the following explanation, and the repetitive description thereof will be omitted. In order to make the description clear, the drawings are schematically illustrated in comparison with actual aspects in some cases. However, the illustration is only one example, and does not limit the interpretation of the invention of the present disclosure.

Examples will be explained below with reference to the drawings.

First Example

Figure 1:
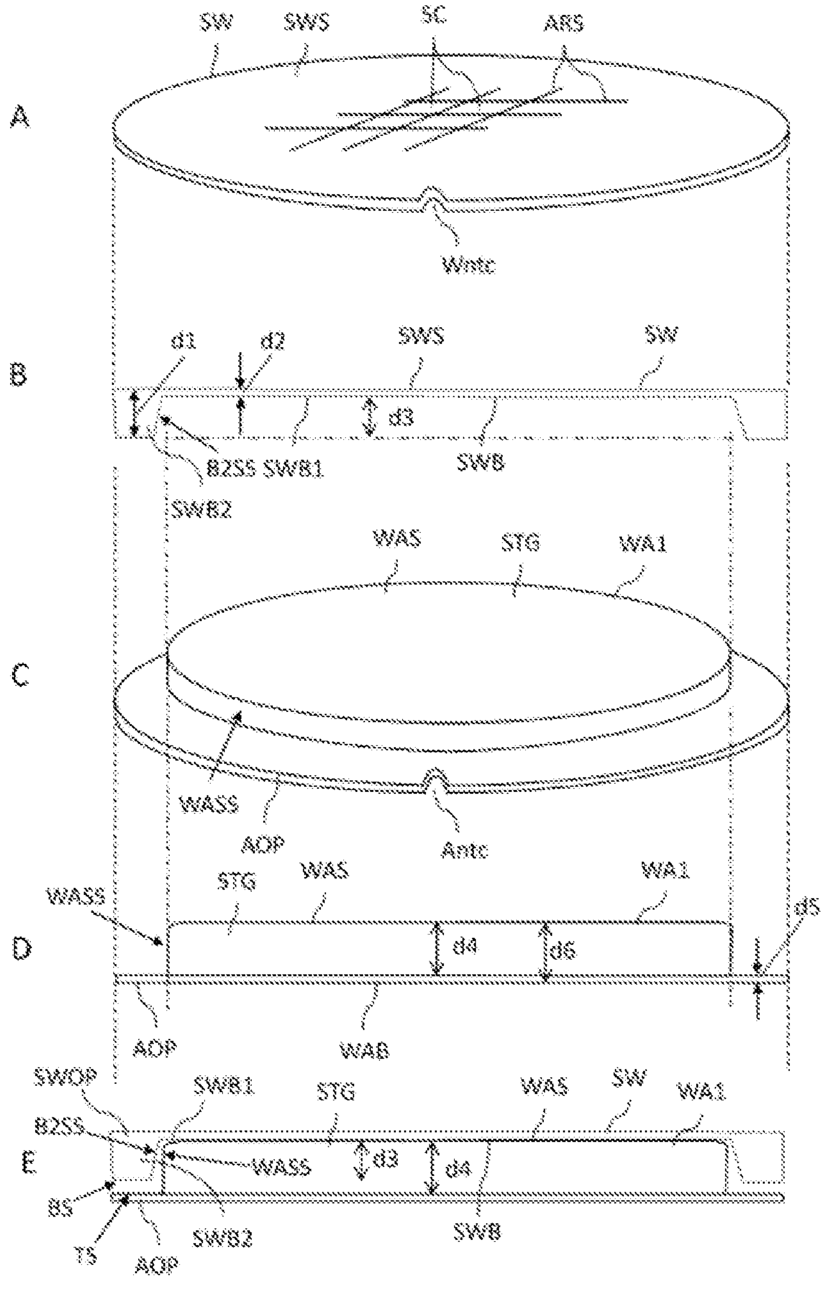
FIG. 1 is an explanatory view of a semiconductor wafer and a wafer holding member having a first configuration according to a first example.
Figure 2:
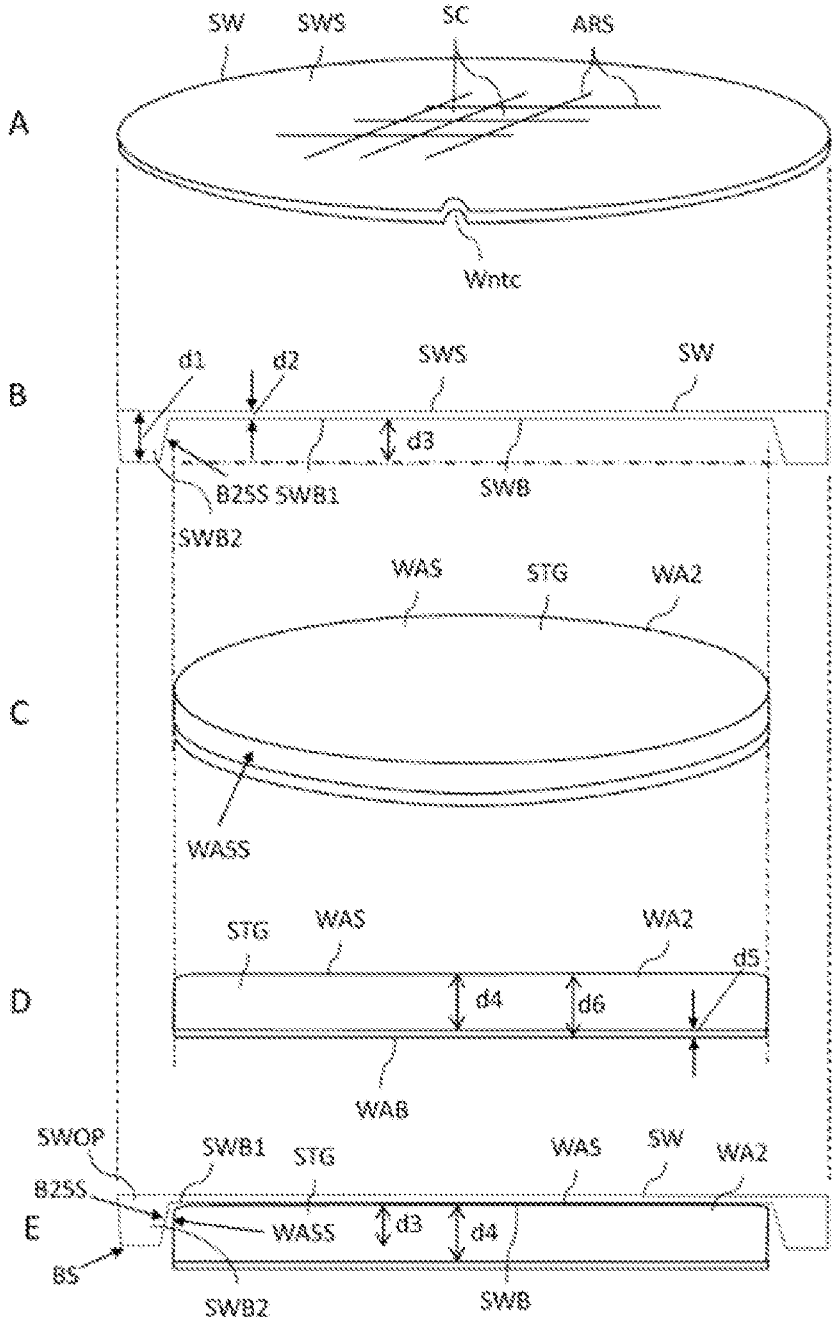
FIG. 2 is an explanatory view of a semiconductor wafer and a wafer holding member having a second configuration according to the first example.
Figure 3:
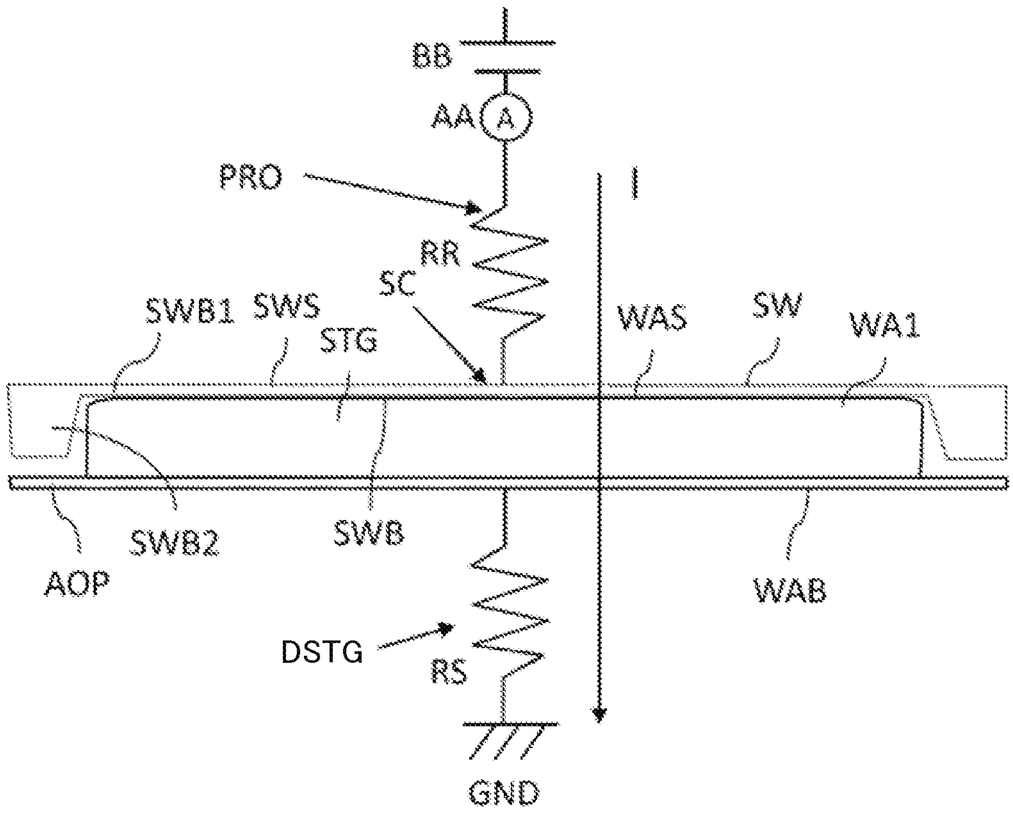
FIG. 3 is an explanatory view of a step of evaluating electric characteristics of a semiconductor wafer to which a wafer holding member is attached.
Figure 4:
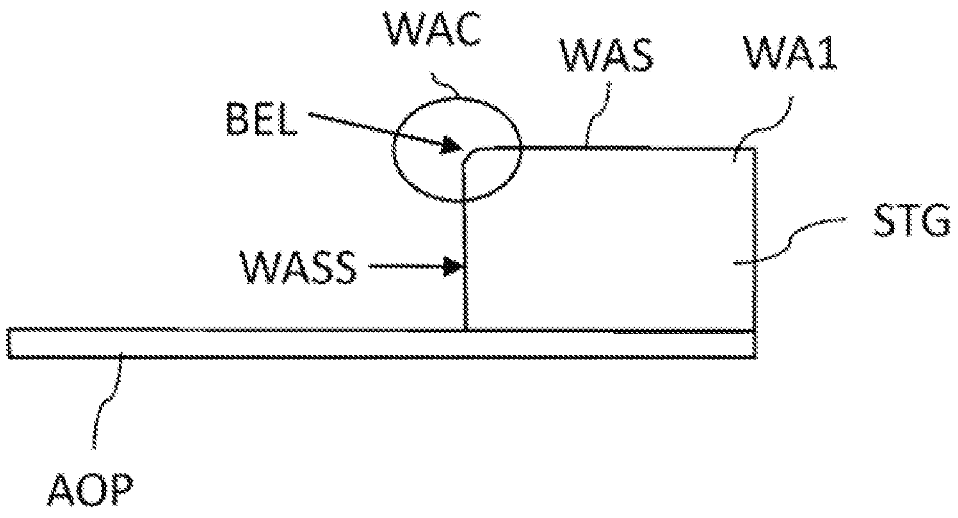
FIG. 4 is an explanatory view of a wafer holding member including a beveled stage.
Figure 5:
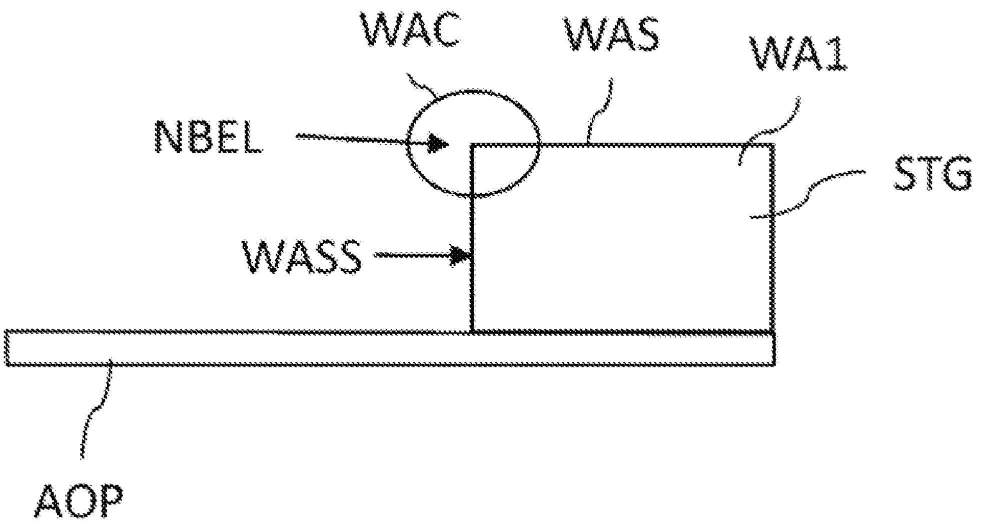
FIG. 5 is an explanatory view of a wafer holding member including a not-beveled stage.

FIG. 1 is an explanatory view of a semiconductor wafer and a wafer holding member having a first configuration according to a first example. FIG. 2 is an explanatory view of a semiconductor wafer and a wafer holding member having a second configuration according to the first example. FIG. 3 is an explanatory view of a step of evaluating electric characteristics of a semiconductor wafer to which a wafer holding member is attached. FIG. 4 is an explanatory view of a wafer holding member including a beveled stage. FIG. 5 is an explanatory view of a wafer holding member including a not-beveled stage.

FIG. 1 shows a perspective view A of a thinned semiconductor wafer SW, a cross-sectional view B of the semiconductor wafer SW, a perspective view C of a wafer holding member WA1 having a first configuration, a cross-sectional view D of the wafer holding member WA1, and a cross-sectional view E showing a state of attachment of the semiconductor wafer SW to the wafer holding member WA1.

As shown in the perspective view A of FIG. 1, the semiconductor wafer SW is the semiconductor wafer thinned by the TAIKO process, and a plurality of semiconductor chips SC that are partitioned by a grid-form scribe region (scribe line, spacing) ARS are formed on a front surface (first main surface, upper surface) SWS of the semiconductor wafer SW. A part of an outer periphery of the semiconductor wafer SW is provided with a notch (second notch) Wntc. In FIG. 1, the grid-form scribe region ARS is schematically illustrated in order to avoid complexity of the drawing. A semiconductor device is formed in the semiconductor chip SC. As an example of the semiconductor device, a semiconductor device including an Insulated Gate Bipolar Transistor (IGBT) or a power Metal-Oxide-Semiconductor Field Effect Transistor (MOSFET) can be exemplified. However, the semiconductor device is of course not limited to these components.

As shown in the cross-sectional view B of FIG. 1, the semiconductor wafer SW includes a front surface SWS and a back surface (first back surface) SWB opposite to the front surface SWS. A small thickness portion SWB1 and a large thickness portion SWB2 surrounding the small thickness portion SWB1 in a plan view are formed by using the TAIKO process (back-surface grind step) to grind the first back surface SWB of the semiconductor wafer SW. The large thickness portion SWB2 is formed on the outer periphery of the semiconductor wafer SW so as to surround the small thickness portion SWB1 in a plan view. If it is assumed that a thickness of the large thickness portion SWB2 is "d1" while a thickness of the small thickness portion SWB1 is "d2", a grind thickness "d3" of the grinding of the first back surface SWB is expressed as "$d3=d1-d2$".

As shown in the perspective view C and the cross-sectional view D of FIG. 1, the wafer holding member (wafer adaptor) WA1 having the first configuration includes a columnar stage STG having a wafer placement surface WAS and a back surface (second back surface) WAB opposite to the wafer placement surface WAS. In a plan view, the wafer holding member WA1 includes an outer periphery AOP that is formed on the second back surface WAB side to surround the outer periphery of the stage STG. In the wafer holding member WA1, a thickness "d4" of the stage STG (that is "$d4=d6-d5$": corresponding to a thickness of the stage STG provided by subtracting a thickness "d5" of the outer periphery AOP from a distance "d6" between the wafer placement surface WAS of the stage STG and the second back surface WAB) has a larger thickness ($d4>d3$) than a difference ($d1-d2=d3$) between the thickness d1 of the large thickness portion SWB2 of the semiconductor wafer SW and the thickness d2 of the small thickness portion SWB1. A part of the outer periphery AOP is provided with a notch (first notch) Antc. A conductive material or a metal material having good electrical conduction and thermal conduction such as stainless SUS, aluminum AL, silicon Si, carbon C, magnesium (Mg) alloy and aluminum (Al) alloy is applicable to the wafer holding member WA1. In other words, the stage STG and the outer periphery AOP are made of the same conductive metal material to be unified.

The cross-sectional view E of FIG. 1 is a cross-sectional view showing a state in which the semiconductor wafer SW is attached to (fitted into) the wafer holding member WA1. In the placement step of placing the semiconductor wafer SW onto the wafer holding member WA1, the semiconductor wafer SW is placed on the wafer holding member WA1 so that the small thickness portion SWB1 of the semiconductor wafer SW and the wafer placement surface WAS of the wafer holding member WA1 are in contact with each other on the first back surface SWB side of the semiconductor wafer SW. Also, the semiconductor wafer SW is placed on the wafer placement surface WAS of the wafer holding member WA1 so that the large thickness portion SWB2 of the semiconductor wafer SW and the wafer holding member WA1 are not in contact with each other. Also, the semiconductor wafer SW is placed on the stage STG so that a bottom surface BS of the large thickness portion SWB2 of the semiconductor wafer SW and a top surface TS of the outer periphery AOP of the wafer holding member WA1 face each other. In the placement step, the semiconductor wafer SW is placed on the wafer placement surface WAS of the stage STG so that the first notch Antc of the wafer holding member WA1 and the second notch Wntc of the semiconductor wafer SW overlap each other. By the first notch Antc of the wafer holding member WA1 and the second notch Wntc of the semiconductor wafer SW, alignment of the semiconductor wafer SW being placed on the wafer holding member WA1 is made easy. And, in the movement step of moving the semiconductor wafer SW, the semiconductor wafer SW is moved in a state in which the semiconductor wafer SW is held on the wafer holding member WA1.

As shown in the cross-sectional view E of FIG. 1, the wafer holding member WA1 has a structure into which the thinned semiconductor wafer SW is fitted, and the entire outer shape of the fitted semiconductor wafer SW and wafer holding member WA1 is almost the same as that of a related-art semiconductor wafer (semiconductor wafer not using the TAIKO process: semiconductor wafer without the small thickness portion SWB1). Therefore, in a related-art test apparatus (fully-automated prober) or others, the semiconductor wafer SW can be handled by the wafer holding member WA1 as similar to a related-art semiconductor wafer.

In the fit state of the thinned semiconductor wafer SW into the wafer holding member WA1, the bottom portion of the outermost periphery of the semiconductor wafer SW (that is the bottom surface BS of the large thickness portion SWB2) has a structure not being in contact with the top surface TS of the outer periphery AOP of the wafer holding member WA1 (see the cross-sectional view E of FIG. 1). An outer side surface (sidewall) WASS of the columnar stage STG has a structure not being in contact with an inner side surface B2SS of the large thickness portion SWB2. By these structures, an outer periphery SWOP of the semiconductor wafer SW is not floated up, and crack of the semiconductor wafer SW can be prevented. And, since the wafer holding member WA1 includes the outer periphery AOP, the semiconductor wafer when being mounted on the wafer slot case can be easily set thereon.

FIG. 2 shows a perspective view A of the thinned semiconductor wafer SW, a cross-sectional view B of the semiconductor wafer SW, a perspective view C of a wafer holding member WA2 having a second configuration, a cross-sectional view D of the wafer holding member WA2, and a cross-sectional view E showing a state of attachment of the semiconductor wafer SW to the wafer holding member WA2. A difference of the wafer holding member WA2 of FIG. 2 from the wafer holding member WA1 of FIG. 1 is that the wafer holding member WA2 of FIG. 2 does not include the outer periphery AOP formed so as to surround the outer periphery of the stage STG. Other configurations and features of the wafer holding member WA2 are the same as those of the wafer holding member WA1, and therefore, the repetitive explanation thereof will be omitted, but the configurations and features would be of course understood by those skilled in the art.

As similar to the wafer holding member WA1, in the wafer holding member WA2, a thickness "d4" of the stage STG (that is "d4=d6−d5": corresponding to a thickness of the stage STG provided by subtracting a thickness "d5" of the outer periphery AOP of the wafer holding member WA1 from a distance "d6" between the wafer placement surface WAS of the stage STG and the second back surface WAB) has a larger thickness (d4>d3) than a difference (d1−d2=d3) between the thickness d1 of the large thickness portion of the semiconductor wafer SW and the thickness d2 of the small thickness portion.

As shown in the cross-sectional view E of FIG. 2, in the placement step of placing the semiconductor wafer SW onto the wafer holding member WA2, the semiconductor wafer SW is placed on the wafer holding member WA2 so that the small thickness portion SWB1 of the semiconductor wafer SW and the wafer placement surface WAS of the wafer holding member WA2 are in contact with each other on the first back surface SWB side of the semiconductor wafer SW. Also, the semiconductor wafer SW is placed on the wafer placement surface WAS of the wafer holding member WA2 so that the large thickness portion SWB2 of the semiconductor wafer SW and the wafer holding member WA2 are not in contact with each other. And, in the movement step of moving the semiconductor wafer SW, the semiconductor wafer SW is moved in a state in which the semiconductor wafer SW is held on the wafer holding member WA2.

Since the wafer holding member WA2 does not include the outer periphery AOP, the bottom surface BS of the large thickness portion SWB2 is not in contact with the wafer holding member WA2. An outer side surface (sidewall) WASS of the columnar stage STG has a structure not being in contact with an inner side surface B2SS of the large thickness portion SWB2. By this, an outer periphery SWOP of the semiconductor wafer SW is not floated up, and crack of the semiconductor wafer SW can be prevented.

FIG. 3 shows a conceptual view of a step of evaluating electric characteristics of the semiconductor wafer SW to which the wafer holding member (WA1) is attached. The step of evaluating the electric characteristics can test single or plural semiconductor chips SC formed on the semiconductor wafer SW by causing an ammeter "AA" to measure an electric current "I" by applying a voltage to a metal electrode (that is a test electrode, an emitter electrode or a gate electrode in the case of IGBT) that is a first electrode formed in a surface region of the semiconductor chip SC on the front surface SWS of the semiconductor wafer SW and a voltage to a metal electrode (that is a collector electrode in the case of IGBT) that is a second electrode formed on the back surface side of the small thickness portion SWB1 of the semiconductor wafer SW. The back surface WAB of the wafer holding member WA1 is electrically in contact to, for example, a wafer stage unit DSTG of the test apparatus.

As a typical configurational example of the test apparatus, FIG. 3 shows an electric resistance "RR" of the test probe PRO, the ammeter "AA" and a power supply "BB" on the front surface SWS side of the semiconductor wafer SW. FIG. 3 also shows an electric resistance "RS" of the wafer stage unit DSTG that is connected to a ground potential GND, on the back surface WAB side of the wafer holding member WA1. The wafer holding member WA1 of FIG. 3 can be of course replaced with the wafer holding member WA2.

FIG. 4 shows a cross-sectional view of the wafer holding member WA1 including a beveled stage STG, and FIG. 5 shows a cross-sectional view of the wafer holding member WA1 including a not-beveled stage STG. Explanation in FIGS. 4 and 5 will be typically made with reference to the wafer holding member WA1. However, the wafer holding member WA1 can be of course replaced with the wafer holding member WA2.

As shown in FIG. 4, a corner (corner portion) WAC between the wafer placement surface WAS of the stage STG of the wafer holding member WA1 and the outer side surface WASS of the stage STG is in a beveled (beveling) state BEL. In this case, the beveling means that the corner is shaped to have an angulated surface (slope surface), a rounded surface or others. In a point of view of preventing scratch on the back surface SWB of the semiconductor wafer SW and the inner side surface B2SS of the large thickness portion SWB2, the corner WAC of the stage STG of the wafer holding member WA1 (WA2) is preferably beveled. In this manner, even if the semiconductor wafer SW is placed on the wafer holding member WA1 and is moved while being held on the wafer holding member WA1 in the placement step and the movement step, the scratch resulted from the contact between the corner WAC of the stage STG and the back surface SWB of the semiconductor wafer SW is difficult to be made on the back surface SWB of the semiconductor wafer SW.

As shown in FIG. 5, a corner (corner portion) WAC between the wafer placement surface WAS of the stage STG of the wafer holding member WA1 and the outer side surface WASS of the stage STG is in a not-beveled (not-beveling) state NBEL. In a point of view of increasing a contact area between the back surface SWB of the semiconductor wafer SW and the wafer placement surface WAS to decrease a contact resistance between the back surface SWB of the semiconductor wafer SW and the wafer placement surface WAS, the corner WAC of the wafer holding member WA1 (WA2) is preferably not beveled. In this manner, the contact resistance between the back surface SWB of the semiconductor wafer SW and the wafer placement surface WAS can be decreased in the step of evaluating the electric characteristics, and therefore, the electrical signals can be correctly measured.

Next, the wafer holding members WA1 and WA2 will be explained.

(Materials of Wafer Holding Members WA1 and WA2)

The materials of the wafer holding members WA1 and WA2 are determined in consideration of weight, electrical conductivity, thermal resistance, strength and others. In consideration of these factors, a material made of aluminum is preferable.

The weights of the wafer holding members WA1 and WA2 within the weight limitation for the test apparatus are acceptable. However, if the wafer holding members WA1 and WA2 are too heavy, a tweezer for carrying to be contacted in the prober from the back surface SWB side of the semiconductor wafer SW is bent, and therefore, the material is preferably as light as possible.

(Outer Periphery AOP of Wafer Holding Member WA1)

In a point of view of manufacturing easiness of the wafer holding member WA1, the structure (wafer holding member WA2) without the outer periphery AOP is preferable.

(Thicknesses of Wafer Holding Members WA1 and WA2)

The thickness (d6 of FIGS. 1 and 2) of each of the wafer holding members WA1 and WA2 is larger than the difference between the thickness of the large thickness portion SWB2 and the thickness of the small thickness portion SWB1 of the thinned semiconductor wafer SW in order to prevent the wafer crack due to the floating of the outer periphery SWOP (large thickness portion SWB2) of the semiconductor wafer SW. Meanwhile, if the wafer holding members WA1 and WA2 are too thick, there is a risk of erroneously recognizing them to be two semiconductor wafers by the test apparatus. The thickness of each of the wafer holding members WA1 and WA2 is not limited to this, but is preferably, for example, 680 μm to 810 μm. The thickness of each of the wafer holding members WA1 and WA2 is adjusted in accordance with the thickness of the small thickness portion SWB1.

(Size (Area and Dimension) of Wafer Placement Surface WAS of Wafer Holding Members WA1 and WA2 in Plan View)

The size is about the same as the size of the small thickness portion SWB1 of the thinned semiconductor wafer SW or slightly smaller than the size of the small thickness portion SWB1 of the same in a plan view.

(Flatness of Wafer Holding Members WA1 and WA2)

The maximum height of each of the wafer holding members WA1 and WA2 is preferably equal to or smaller than 20 μm. The maximum height "Ry" of each of the wafer holding members WA1 and WA2 is more preferably equal to or smaller than 1 μm. In this manner, when the semiconductor wafer SW is, for example, sucked in vacuum on the wafer stage of the test apparatus, gaps caused by surface unevenness of the wafer placement surface WAS of each of the wafer holding members WA1 and WA2 can be suppressed from being formed between the semiconductor wafer SW and each of the wafer holding members WA1 and WA2. Since the contact between the semiconductor wafer SW and each of the wafer holding members WA1 and WA2 can be flattened, warpage of the semiconductor wafer SW can be suitably reduced. Note that the maximum height Ry is a value expressed in terms of micrometer provided by extracting the member by a reference length in a direction of its average line from a roughness curve and measuring an interval between peak and valley profiles of the extracted section in a direction of vertical magnification of the roughness curve.

Second Example

Next, for example, a wafer suction mechanism made of the wafer stage unit DSTG functioning as a measurement stage of the test apparatus or others and the wafer holding member will be explained.

Figure 6:
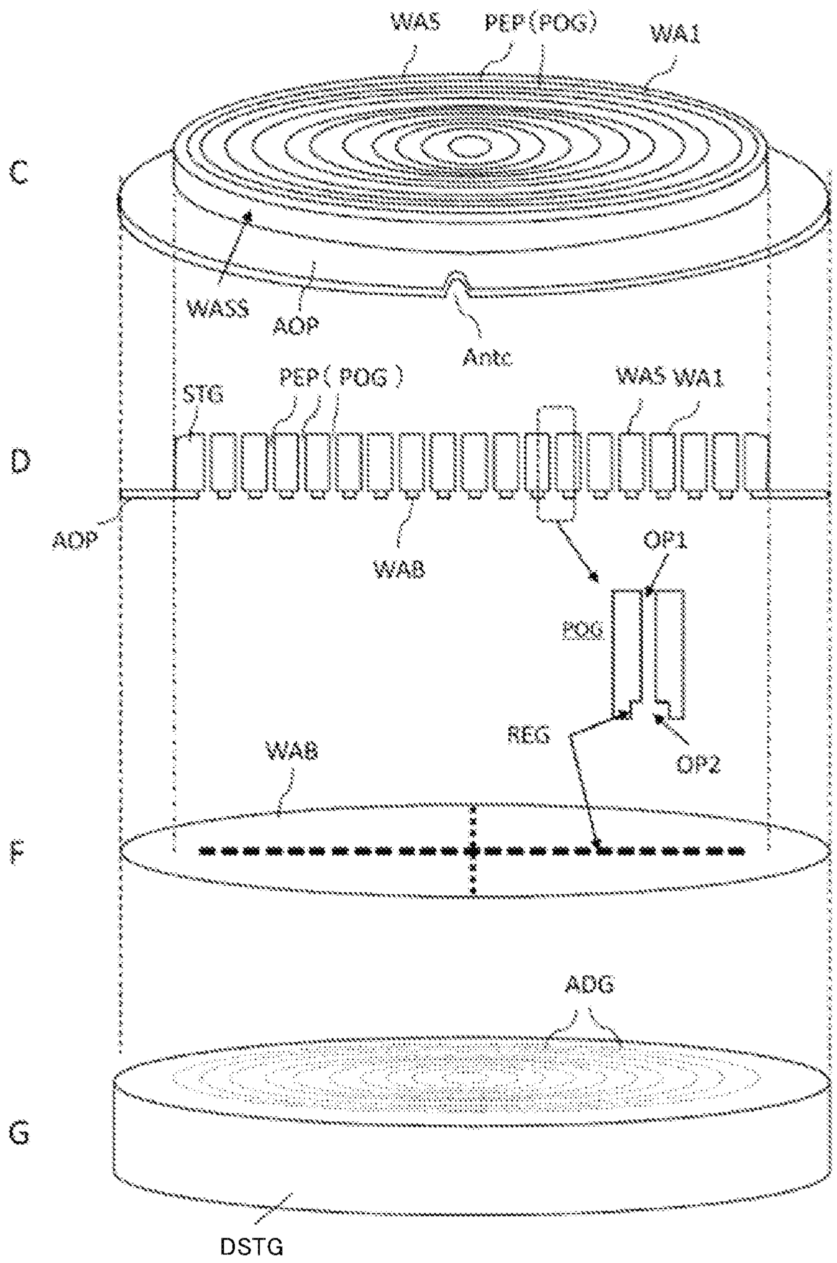
FIG. 6 is an explanatory view of a first wafer suction mechanism made of a wafer stage DSTG and the wafer holding member.
Figure 7:
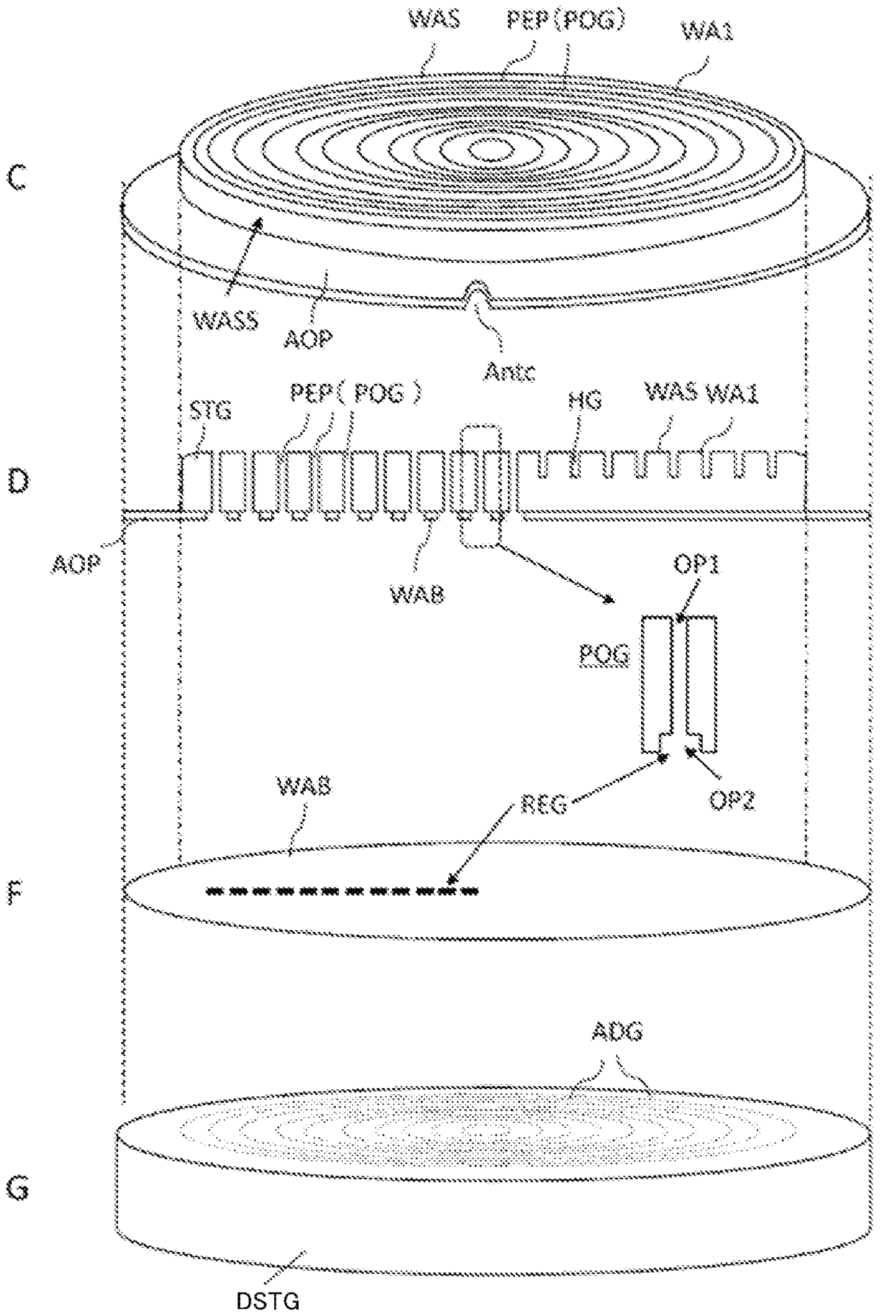
FIG. 7 is an explanatory view of a second wafer suction mechanism made of the wafer stage DSTG and the wafer holding member.
Figure 8:
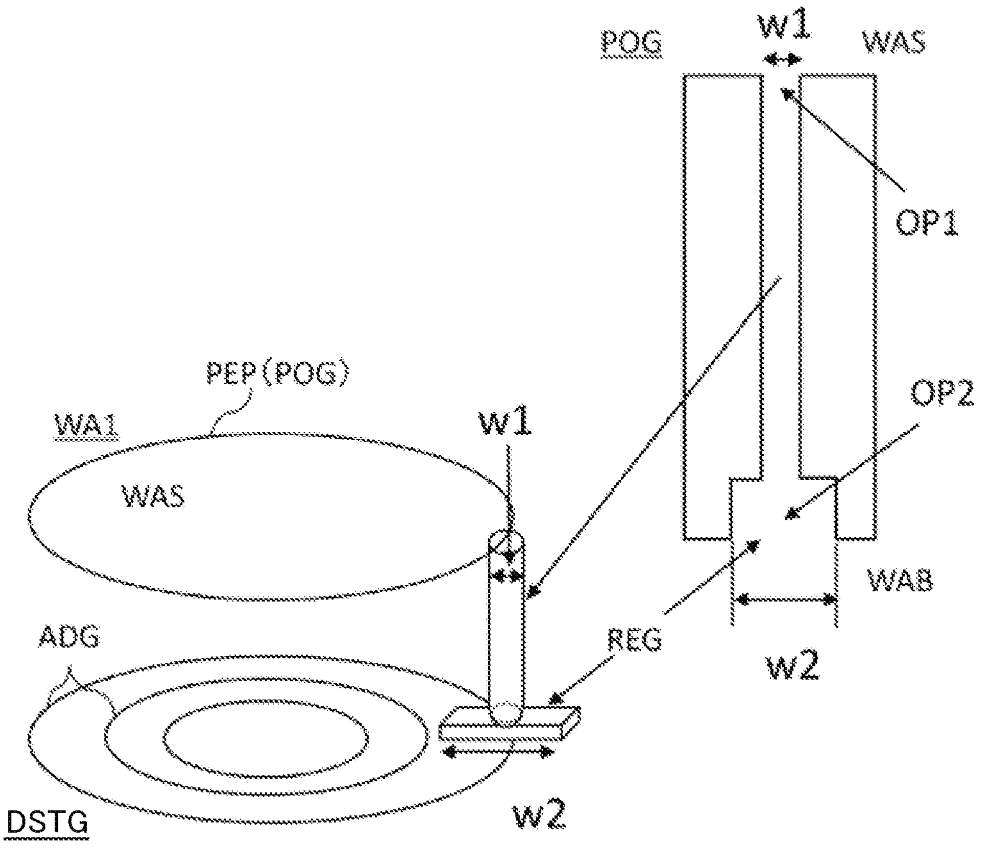
FIG. 8 is an explanatory view of a through groove formed in the wafer holding member.

FIG. 6 is an explanatory view of a first wafer suction mechanism made of the wafer stage unit DSTG and the wafer holding member. FIG. 7 is an explanatory view of a second wafer suction mechanism made of the wafer stage unit DSTG and the wafer holding member. FIG. 8 is an explanatory view of a through groove formed in the wafer holding member. Each of FIGS. 6 and 7 shows a perspective view C of the wafer holding member WA1 having the first configuration, a cross-sectional view D of the wafer holding member WA1, a perspective view F of the back surface WAB of the wafer holding member WA1, and a perspective view G of the wafer stage unit DETS. FIGS. 6 and 7 will be typically explained with reference to the wafer holding member WA1. However, the wafer holding member WA1 can be of course replaced with the wafer holding member WA2.

As shown in the perspective view C and the cross-sectional view D of FIG. 6, the wafer holding member WA1 includes a penetrating portion PEP that are opened on the wafer placement surface WAS and the back surface (second back surface) WAB, and is configured to fix the semiconductor wafer SW placed on the wafer placement surface WAS when the penetrating portion PEP is brought into a negative pressure state. The penetrating portion PEP includes a plurality of through grooves POG, and the plurality of through grooves POG are concentrically opened on the wafer placement surface WAS in a plan view. In this manner, the warpage of the semiconductor wafer SW can be relaxed as a whole at the time of the vacuum suction of the semiconductor wafer SW onto the wafer placement surface WAS.

As shown in the perspective view G of FIG. 6, a plurality of suction grooves ADG are formed as vacuuming grooves for the wafer suction on the surface of the wafer stage unit DSTG. The plurality of suction grooves ADG are concentrically opened on the surface of the wafer stage unit DSTG. The wafer suction mechanism of the wafer holding member WA1 including the penetrating portion PEP and the plurality of through grooves POG transmits a vacuum suction force obtained from the suction groove ADG in the surface of the wafer stage unit DSTG from the back surface side (back surface WAB) to the front surface side (the wafer placement surface WAS).

In the cross-sectional view D of FIG. 6, one through groove POG surrounded by a quadrangular dot line is illustrated to be enlarged. The through groove POG includes a first opening OP1 formed on the wafer placement surface WAS side, and a second opening OP2 formed on the back surface WAB side. The second opening OP2 is a rectangular groove REG in a plan view.

As shown in the perspective view F of FIG. 6, a plurality of rectangular grooves REG are formed in the back surface WAB of the wafer holding member WA1. In this example, the plurality of rectangular grooves REG are arranged in the back surface WAB so as to be along two cross lines.

As shown in FIG. 8, the grooves (the plurality of rectangular grooves REG) in the back surface WAB of the wafer holding member WA1 are shaped into the rectangular shapes crossing the plurality of circumferential suction grooves ADG on the surface of the wafer stage unit DSTG, and therefore, have the structure that cancels the misalignment of the vacuuming connecting portion.

Regarding a first open width W1 of the circular opening OP1 of the through groove POG and a second open width W2 of the second opening OP2 (second open width W2: a length of the rectangular groove REG in a longitudinal direction), the second open width W2 of the penetrating portion opened on the second back surface is preferably larger than the first open width W1 (first open width W1<second open width W2). This configuration (in which the second open width W2 is larger than the first open width W1) can cancel the influence of the misalignment of the wafer holding member WA1 when the wafer holding member WA1 on which the semiconductor wafer SW is mounted is placed on the wafer stage unit DSTG, and therefore, communication between the suction groove ADG of the wafer stage unit DSTG and the rectangular groove REG of the back surface WAB of the wafer holding member WA1 can be reliably made.

In other words, the steps of manufacturing the semiconductor device include a placement step (second placement step) of placing the wafer holding member (WA1, WA2) and the semiconductor wafer SW onto the measurement stage DSTG including the suction grooves ADG for the vacuum suction formed therein in the state in which the semiconductor wafer SW is placed on the wafer holding member (WA1, WA2). In the second placement step, the wafer holding member (WA1, WA2) is placed on the measurement stage DSTG so that the penetrating portions (the penetrating portion PEP, the plurality of through grooves POG) and the suction grooves ADG communicate to each other.

Since the warpage of the thinned semiconductor wafer SW is large, the reliable vacuuming of the thinned semiconductor wafer SW to the wafer holding member WA1 (WA2) can reduce the warpage of the thinned semiconductor wafer SW, and therefore, can make the stable evaluation. In the high-temperature evaluation, the warpage of the semiconductor wafer SW is of the more significant problem often. However, since the semiconductor wafer SW can be reliably sucked in vacuum to the wafer holding member WA1 (WA2), the warpage of the semiconductor wafer SW in the high-temperature evaluation is of no problem.

As shown in the perspective view F of FIG. 7, the number of the plurality of rectangular grooves REG formed in the back surface WAB of the wafer holding member WA1 can be made smaller than the number of the plurality of rectangular grooves REG shown in the perspective view F of FIG. 6. In this example, the plurality of rectangular grooves REG are arranged in the back surface WAB so as to be along a line having about a half length of the diameter of the back surface WAB. Regarding the rectangular grooves REG, one rectangular groove REG per one through groove POG of the plurality of circumferential through grooves POG on the wafer placement surface WAS side of the wafer holding member WA1 may be formed. Therefore, as shown in the cross-sectional view D of FIG. 7, in this example, the right half of the wafer holding member WA1 is not the through groove POG but a groove HG connected to the through groove POG.

Third Example

Figure 9:
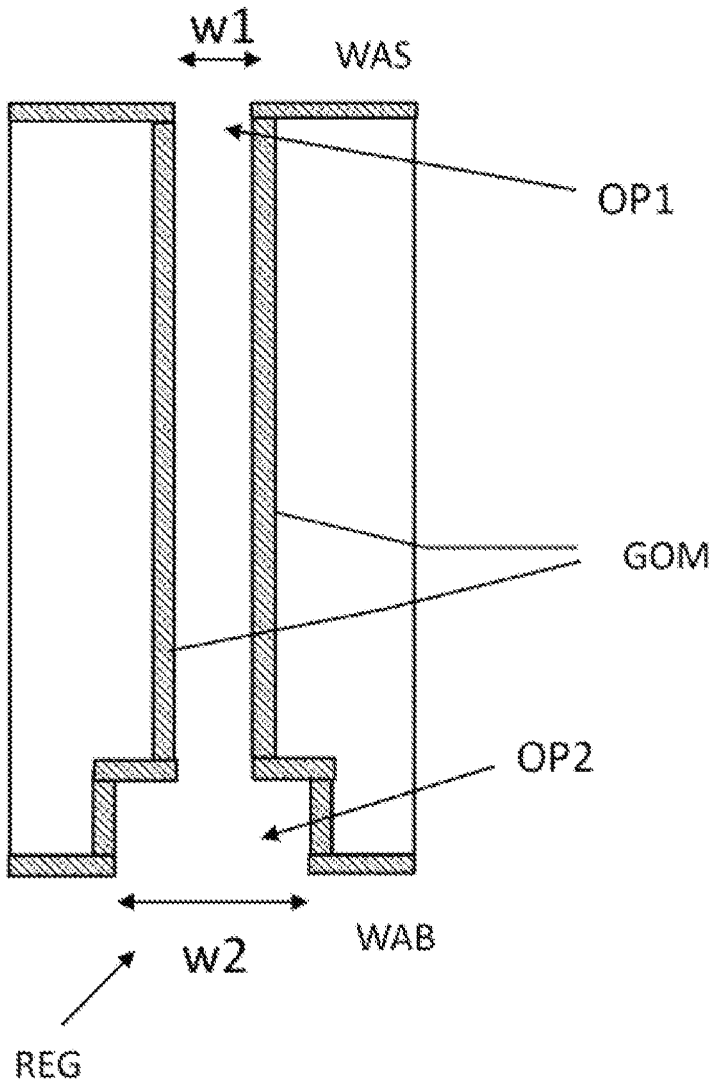
FIG. 9 is an explanatory view of a configuration for reducing an electric resistance of the wafer holding member (WA1, WA2) with reference to FIG. 9.

Next, a configuration for reducing the electric resistance of the wafer holding member (WA1, WA2) will be explained with reference to FIG. 9. FIG. 9 is a cross-sectional view of the gold-plated wafer holding member (WA1, WA2). This cross-sectional view shows one enlarged through groove POG.

As shown in FIG. 9, a gold plate layer GOM is formed so that the wafer placement surface WAS of the wafer holding member (WA1, WA2), the back surface WAB and a side surface of the through groove POG inside the wafer holding member (WA1, WA2) are plated with gold. In this manner, the electric resistances of the wafer placement surface WAS of the wafer holding member (WA1, WA2) and the back surface WAB can be reduced.

The resistance of the contact between the back surface SWB of the semiconductor wafer SW and the wafer placement surface WAS, the electric resistances of the wafer placement surface WAS of the wafer holding member (WA1, WA2) and the back surface WAB and the resistance of the contact between the back surface WAB of the wafer holding member (WA1, WA2) and the surface of the wafer stage unit DSTG can be reduced, and therefore, the electric signals can be correctly measured in the step of evaluating the electric characteristics.

Fourth Example

Figure 10:
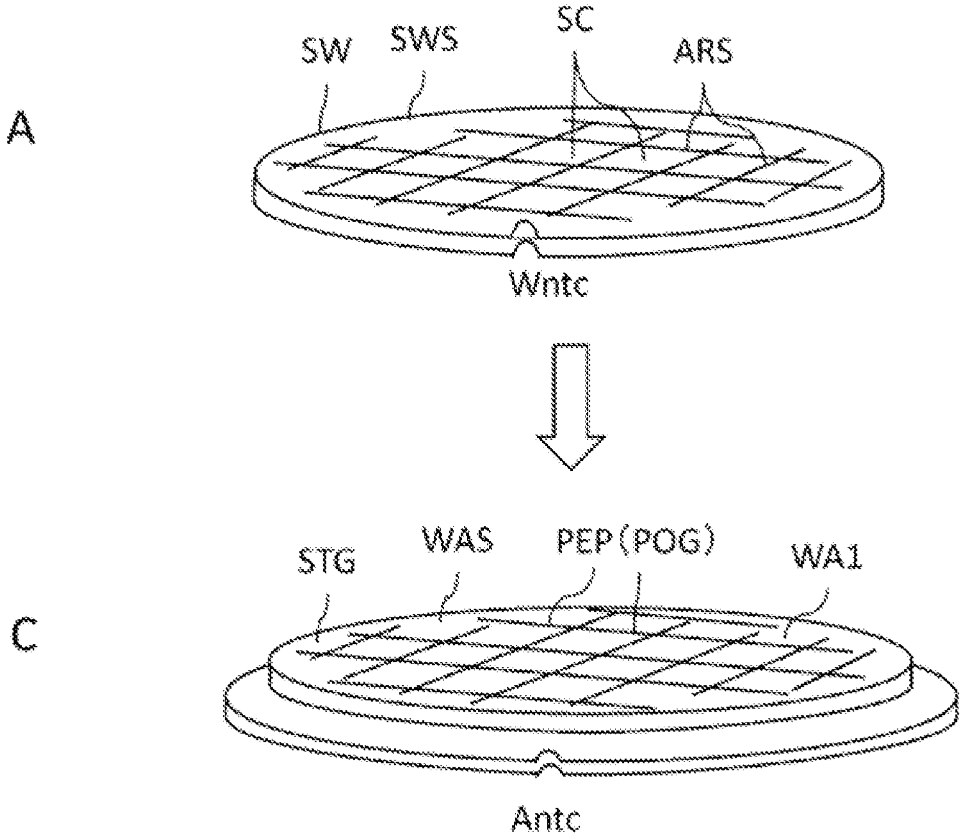
FIG. 10 is an explanatory view of a semiconductor wafer and a wafer holding member having a first configuration according to a fourth example.

Next, with reference to FIG. 10, a configuration with grid arrangement of the penetrating portion PEP in the wafer placement surface WAS of the wafer holding member (WA1, WA2) to match a grid shape of the scribe region in the semiconductor wafer SW will be explained. FIG. 10 is an explanatory view of a semiconductor wafer and a wafer holding member having a first configuration according to a fourth example. FIG. 10 shows a perspective view A of the semiconductor wafer SW and a perspective view C of the wafer holding member WA1.

As shown in the perspective view A of FIG. 10, a plurality of semiconductor chips SC that are partitioned by the grid-form scribe region (scribe line, spacing) ARS are formed on the front surface (first main surface, upper surface) SWS of the semiconductor wafer SW. In other words, the semiconductor wafer SW includes the plurality of semiconductor chips SC functioning as a plurality of cell regions spaced apart from each other and a scribe region ARS formed between the plurality of cell regions (semiconductor chips SC). In this case, in the IGBT or the power MOSFET, the plurality of cell regions are, for example, regions where the power transistor cells of the IGBT or the power MOSFET are formed.

As shown in the perspective view C of FIG. 10, the penetrating portions PEP that are arranged in the grid form are formed on the wafer placement surface WAS of the wafer holding member WA1 to match the shape of the scribe region ARS of the semiconductor wafer SW. The penetrating portion PEP of the wafer holding member WA1 in a plan view is formed to overlap the scribe region ARS of the semiconductor wafer SW. Therefore, in the placement step of placing the semiconductor wafer SW onto the wafer holding member WA1, when the semiconductor wafer SW is placed onto the wafer placement surface WAS of the stage STG so that the first notch Antc of the wafer holding member WA1 and the second notch Wntc of the semiconductor wafer SW overlap each other, the penetrating portion PEP of the wafer holding member WA1 in a plan view is placed to overlap the scribe region ARS of the semiconductor wafer SW. And, in the movement step of moving the semiconductor wafer SW, the semiconductor wafer SW is moved in the state in which the semiconductor wafer SW is held on the wafer holding member WA1. Then, the wafer holding member WA1 on which the semiconductor wafer SW is mounted is placed on, for example, the wafer stage unit DSTG of the test apparatus (in a second placement step).

In the step of evaluating the electric characteristics, single or plural semiconductor chips SC formed on the semiconductor wafer SW are tested by applying a voltage to a metal electrode (that is a collector electrode in the case of IGBT) that is a second electrode formed on the back surface side of the small thickness portion SWB1 of the semiconductor wafer SW through a test probe PRO in contact with a metal electrode (that is a test electrode, an emitter electrode or a gate electrode in the case of IGBT) that is a first electrode formed in a surface region of the semiconductor chip SC on the front surface SWS of the semiconductor wafer SW and the wafer holding member WA made of a conductive material.

Figure 11:
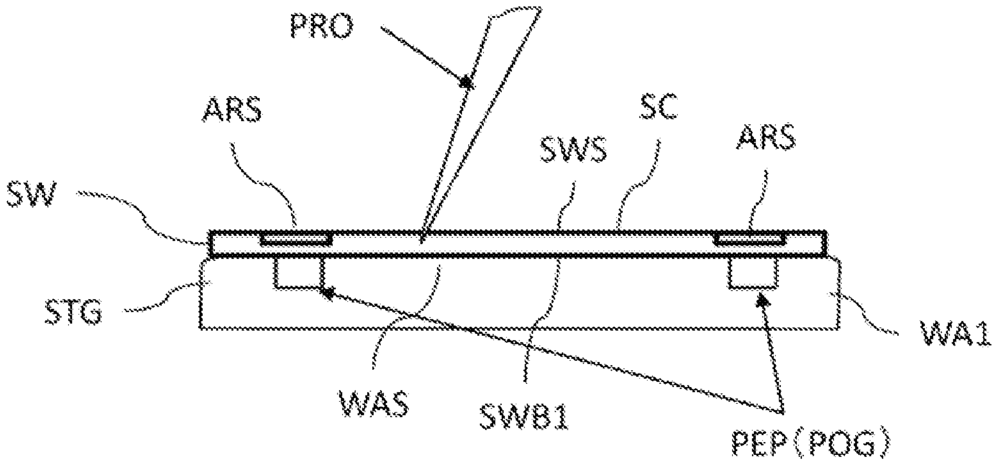
FIG. 11 is cross-sectional views of a test probe PRO, a semiconductor wafer SW and a wafer holding member WA1 in a step of evaluating electric characteristics according to the fourth example.
Figure 12:
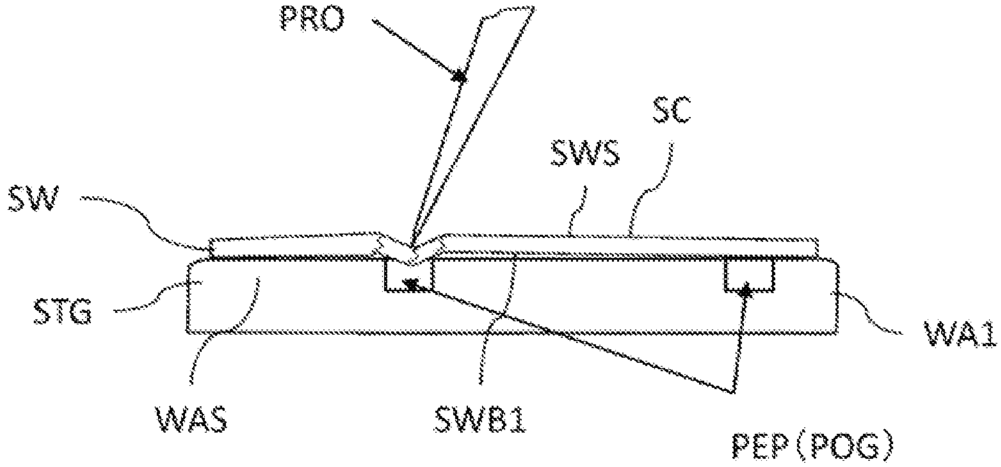
FIG. 12 is cross-sectional views of a test probe PRO, a semiconductor wafer SW and a wafer holding member WA1 in a step of evaluating electric characteristics according to a comparative example.

FIG. 11 is cross-sectional views of the test probe PRO, the semiconductor wafer SW and the wafer holding member WA1 in the step of evaluating the electric characteristics according to a fourth example. FIG. 12 is cross-sectional views of the test probe PRO, the semiconductor wafer SW and the wafer holding member WA1 in the step of evaluating the electric characteristics according to a comparative example.

As shown in FIG. 11, the penetrating portion PEP of the wafer holding member WA1 in a plan view is arranged to overlap the scribe region ARS of the semiconductor wafer SW, and therefore, the test probe PRO can be reliably and easily in contact with the first electrode formed in the surface region of the semiconductor chip SC. Therefore, the test probe PRO is easily allowed to perform the probing while avoiding the penetrating portion PEP, and thus, the wafer crack of the semiconductor wafer SW can be prevented.

On the other hand, as shown in FIG. 12, if the penetrating portion PEP of the wafer holding member WA1 exists below the test probe PRO when the test probe PRO is in contact with the first electrode formed in the surface region of the semiconductor chip SC, the wafer crack of the semiconductor wafer SW may be caused. In other words, the test probe PRO may be not allowed to perform the probing while avoiding the penetrating portion PEP. The problem explained in FIG. 12 can be solved by the fourth example.

With reference to drawings, some methods of manufacturing the semiconductor device will be explained below.

Fifth Example

Figure 13:
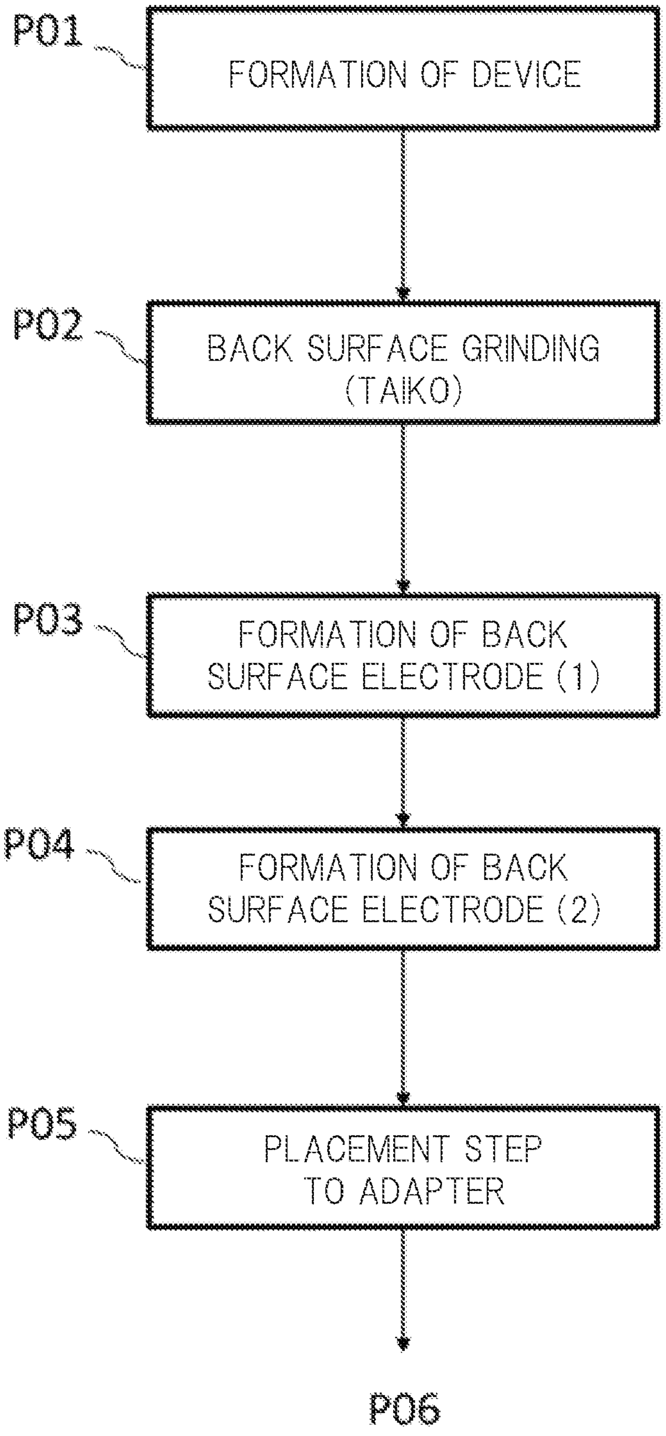
FIG. 13 is a flowchart of a method of manufacturing a semiconductor device according to a fifth example.
Figure 14:
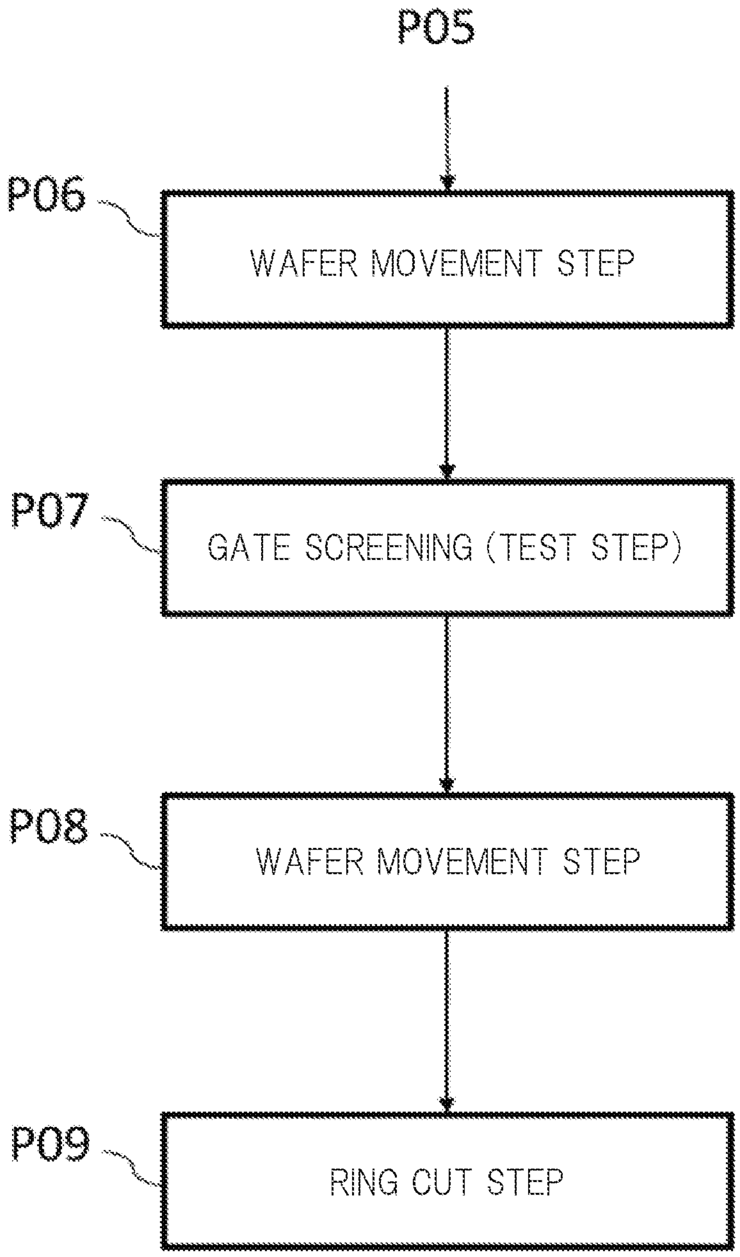
FIG. 14 is a flowchart of the method of manufacturing the semiconductor device, continued from the flowchart of FIG. 13.
Figure 17:
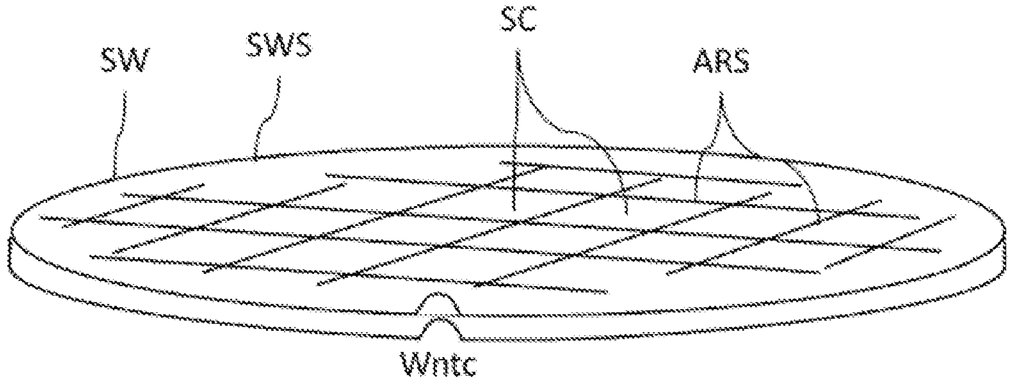
FIG. 17 is a perspective view of a semiconductor wafer SW on which a plurality of semiconductor devices are formed.
Figure 18:
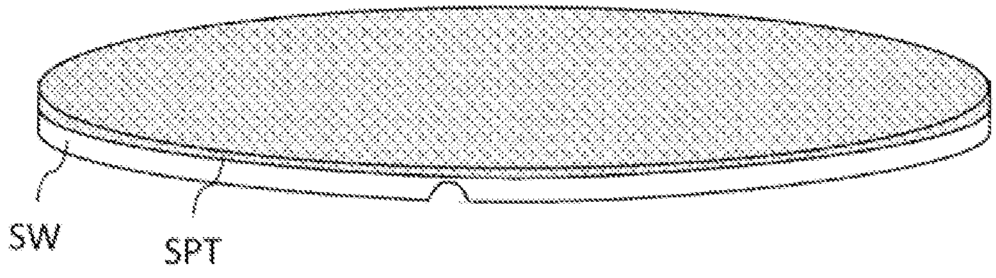
FIG. 18 is an explanatory perspective view of pasting of a protection tape onto the surface of the semiconductor wafer.
Figure 19:
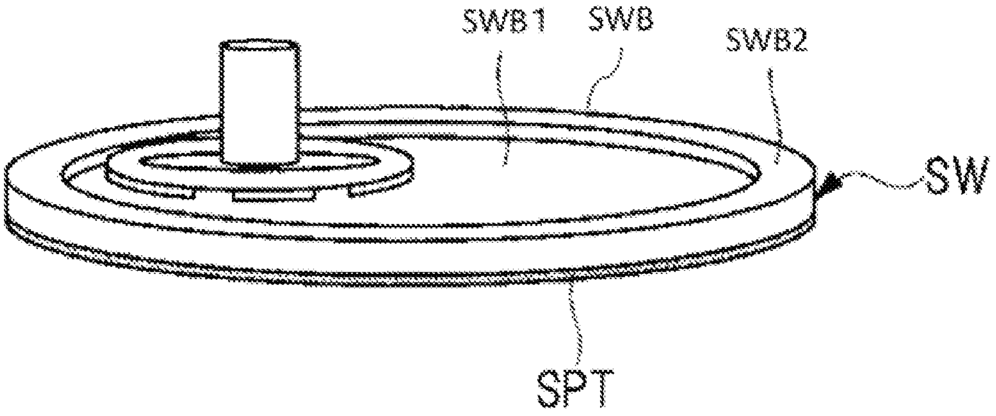
FIG. 19 is an explanatory perspective view of a step of grinding the back surface of the semiconductor wafer.
Figure 20:
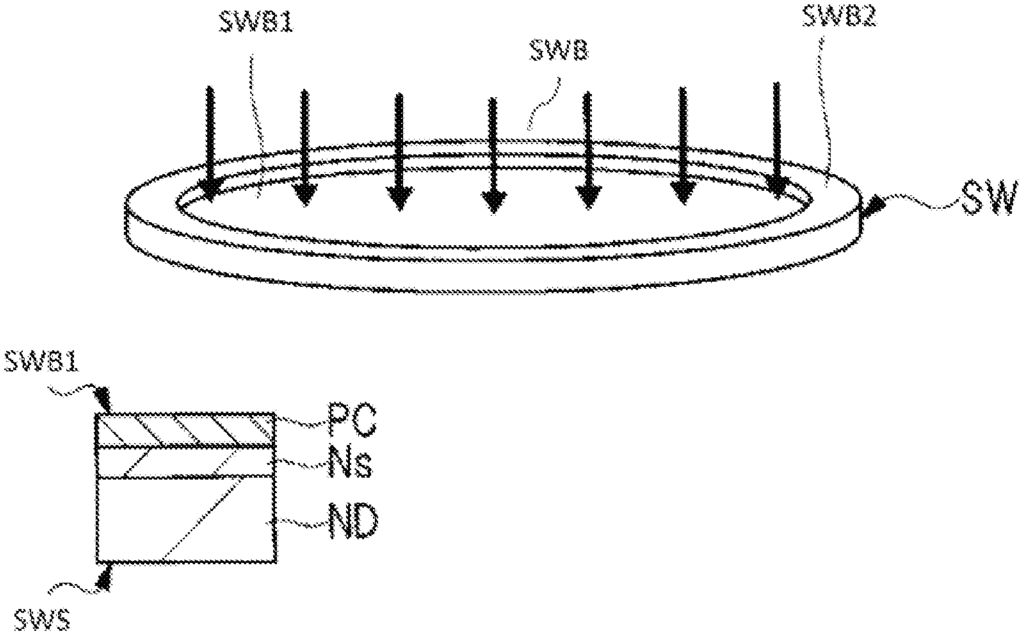
FIG. 20 is an explanatory perspective view of a step of ion implantation onto the back surface of the semiconductor wafer.
Figure 21:
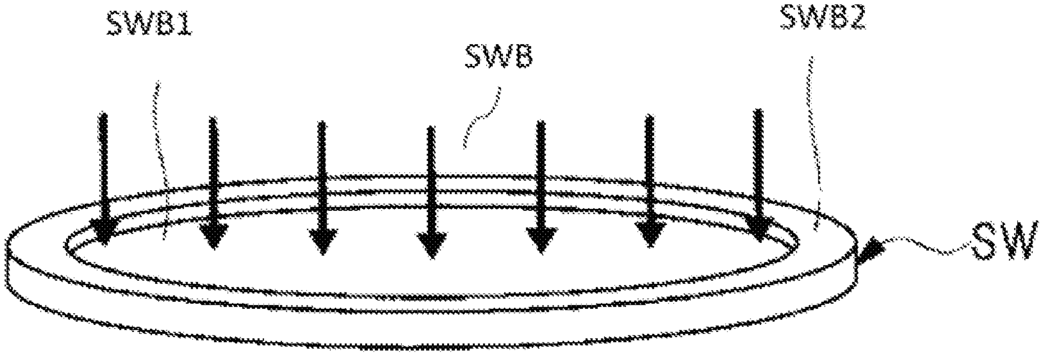
FIG. 21 is an explanatory perspective view of an anneal processing step.
Figure 22:
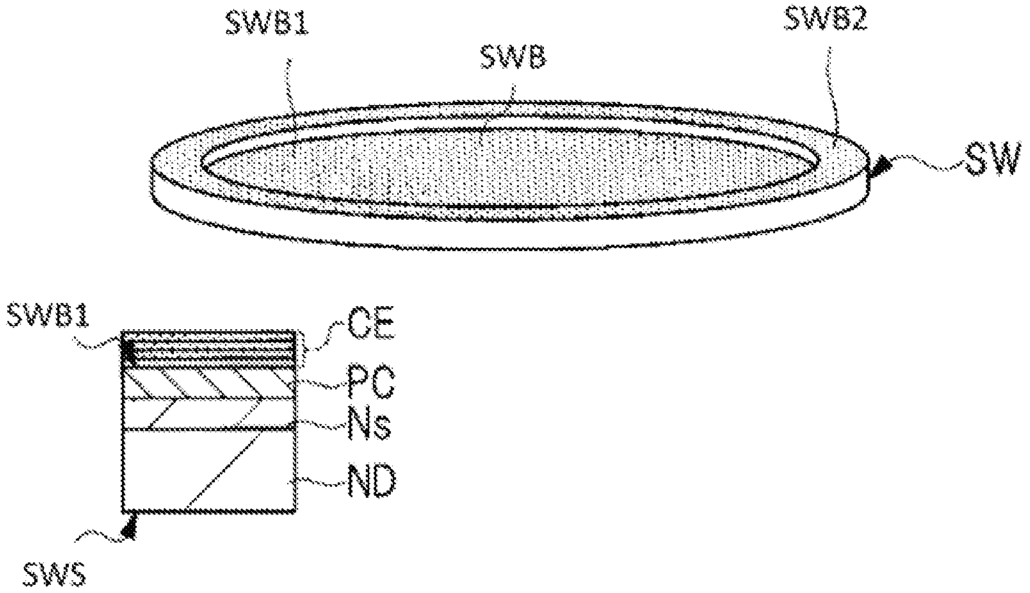
FIG. 22 is an explanatory perspective view of a step of forming a back-surface electrode.
Figure 23:
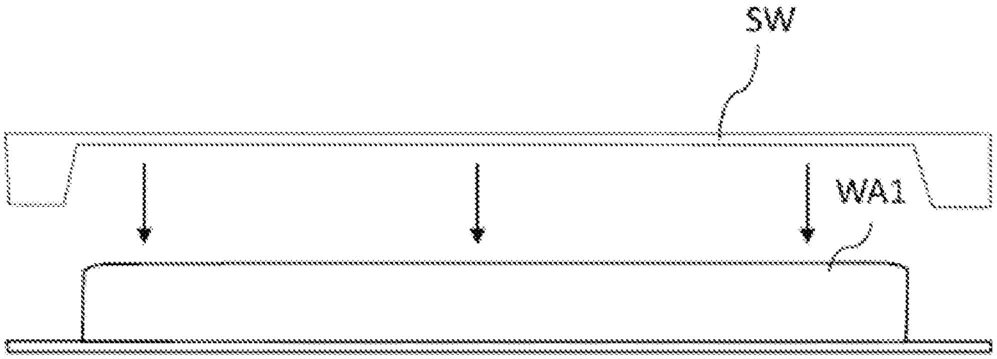
FIG. 23 is an explanatory perspective view of a step of placing the semiconductor wafer SW onto the wafer holding member WA1.
Figure 24:
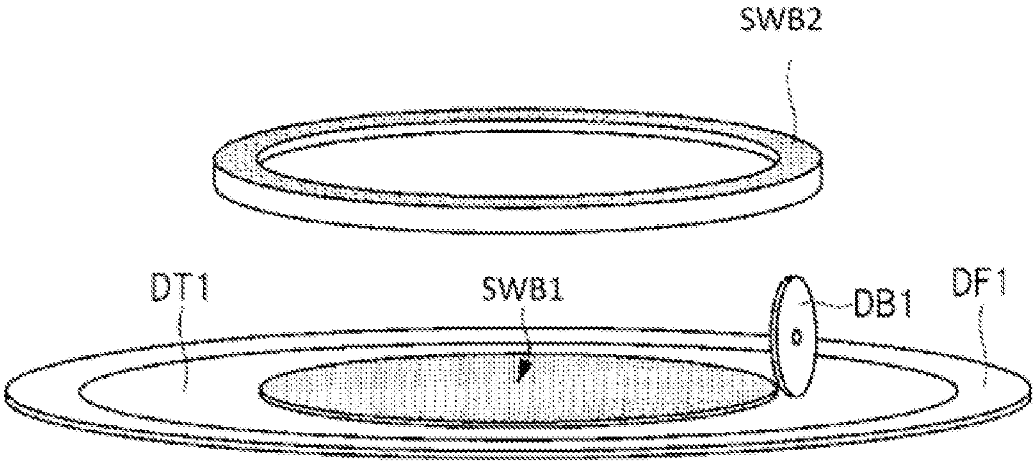
FIG. 24 is an explanatory perspective view of a ring cut step.

FIG. 13 is a flowchart of a method of manufacturing a semiconductor device according to a fifth example. FIG. 14 is a flowchart of the method of manufacturing the semiconductor device, continued from the flowchart of FIG. 13. FIG. 17 is a perspective view of a semiconductor wafer SW on which a plurality of semiconductor devices are formed. FIG. 18 is an explanatory perspective view of pasting of a protection tape onto the surface of the semiconductor wafer. FIG. 19 is an explanatory perspective view of a step of grinding the back surface of the semiconductor wafer. FIG. 20 is an explanatory perspective view of a step of ion implantation onto the back surface of the semiconductor wafer. FIG. 21 is an explanatory perspective view of an anneal processing step. FIG. 22 is an explanatory perspective view of a step of forming a back surface electrode. FIG. 23 is an explanatory perspective view of a step of placing the semiconductor wafer SW onto the wafer holding member WA1. FIG. 24 is an explanatory perspective view of a ring cut step.

First, the semiconductor wafer SW including the plurality of semiconductor devices (semiconductor chips SC) formed on an upper surface of the semiconductor wafer SW is prepared (Step P01). The plurality of semiconductor chips SC that are partitioned by the grid-form scribe region (scribe line, spacing) ARS are formed on the front surface SWS of the semiconductor wafer SW. The semiconductor chip SC in this example is the IGBT.

Next, the back surface (second main surface, lower surface) of the semiconductor wafer SW is ground (by the TAIKO back-surface grinding: Step P02). In the grind step, the small thickness portion SWB1 and the large thickness portion SWB2 surrounding the small thickness portion SWB1 in a plan view are formed by grinding the first back surface SWB of the semiconductor wafer SW including the front surface SWS and the first back surface SWB opposite to the front surface SWS. In this case, the preparation step of preparing the wafer holding member WA1 (WA2) may be performed. The preparation step of preparing the wafer holding member WA1 (WA2) is for preparing the wafer holding member WA1 (WA2) including the wafer placement surface WAS and the second back surface WBA opposite to the wafer placement surface WAS and having the larger thickness than the difference between the thickness of the large thickness portion SWB2 and the thickness of the small thickness portion SWB1.

First, as shown in FIG. 18, the surface protection tape SPT is pasted on the front surface of the semiconductor wafer SW. As the surface protection tape SPT, a high stiffness tape made of, for example, polyethylene terephthalate (PET) as its material can be used.

In the TAIKO back-surface grinding, as shown in FIG. 19, the semiconductor wafer SW is thinned (the small thickness portion SWB1 is formed) by grinding the semiconductor wafer SW from the back surface SWB side while putting the upper surface SWS protected by the surface protection tape SPT to face down. The surface protection tape SPT is pasted on the front surface SWS of the semiconductor wafer SW, and therefore, the semiconductor element such as the IGBT, each electrode and others formed on the front surface SWS are not broken. Note that the thickness of the small thickness portion SWB1 of the semiconductor wafer SW depends on the necessary breakdown voltage. Then, the surface protection tape SPT is peeled off from the semiconductor wafer SW.

Next, the back-surface electrode is formed (1) (step P03). A configurational example of the back surface electrode of the IGBT will be explained here. First, as shown in FIG. 20, an n-type field stop region Ns having a first depth from the back surface SWB of the semiconductor wafer SW is formed by ion-implantation of an impurity (such as phosphorus) having an n-type conductivity to the back surface SWB of the semiconductor wafer SW. Subsequently, a $p^+$-type collector region PC having a second depth shallower than the first depth, from the back surface SWB of the semiconductor wafer SW is formed by ion-implantation of an impurity (such as boron) having a p-type conductivity to the back surface SWB of the semiconductor wafer SW. In this manner, the n-type field stop region Ns and the $p^+$-type collector region PC are formed on the back surface SWB side of the semiconductor wafer SW. Note that a term "ND" represents an $n^-$-type drift region. Next, as shown in FIG. 21, the impurity ions that have been ion-implanted to the semiconductor wafer SW are activated by laser-beam irradiation on the back surface SWB of the semiconductor wafer SW.

Next, the back surface electrode is formed (2) (step P04). The semiconductor wafer SW is cleaned by cleansing liquid containing hydrofluoric acid, and then, a layered film that is formed by a sputtering method or a vacuum vapor deposition method of sequentially depositing, for example, an aluminum film, a titanium film, a nickel film and a gold film is formed as a conductive film (Al/Ti/Ni/Au) on the back surface SWB of the semiconductor wafer SW. This layered film becomes a collector electrode CE electrically connected to the $p^+$-type collector region PC. The collector electrode CE is the back surface electrode.

Next, the semiconductor wafer SW is placed on the wafer placement surface WAS of the wafer holding member WA1 (placement step: step P05). In the placement step, as shown in FIG. 23, the semiconductor wafer SW is placed on the wafer holding member WA1 (WA2) so that the small thickness portion SWB1 of the semiconductor wafer SW and the wafer placement surface WAS of the wafer holding member WA1 (WA2) are in contact with each other on the first back surface SWB side of the semiconductor wafer SW (see the cross-sectional view E of FIG. 1). In the placement step, the semiconductor wafer SW is placed on the wafer holding member WA1 (WA2) so that the large thickness portion SWB2 of the semiconductor wafer SW and the wafer holding member WA1 (WA2) are not in contact with each other. In the placement step, the semiconductor wafer SW is placed on the wafer placement surface WAS of the stage STG so that the large thickness portion SWB2 of the semiconductor wafer SW and the outer periphery AOP of the wafer holding member WA1 face each other. In the placement step, the semiconductor wafer SW is placed on the stage STG so that the first notch Antc of the wafer holding member WA1 and the second notch Wntc of the semiconductor wafer SW overlap each other.

Next, the semiconductor wafer SW is moved (movement step: step P06). In the movement step, the semiconductor wafer SW is moved in the state in which the semiconductor wafer SW is held on the wafer holding member WA1 (WA2) (see the cross-sectional view E of FIG. 1). An apparatus at destination of the movement is, for example, a test stage (measurement stage DSTG) of the test apparatus or an OPM plating apparatus.

Next, a test step is performed (gate screening (test step): step P07). The test step includes: the second placement step of placing the wafer holding member WA1 (WA2) and the semiconductor wafer SW on the test stage (measurement stage) DSTG of the test apparatus; and the test step of testing the semiconductor wafer SW by applying the voltage to the semiconductor wafer SW through the wafer holding member WA1 (WA2).

In the second placement step, in a state in which the semiconductor wafer SW is placed on the wafer placement surface WAS of the wafer holding member WA1 (WA2), the wafer holding member WA1 (WA2) and the semiconductor wafer SW are placed on the measurement stage DSTG including the suction groove ADG for the vacuum suction. In this case, the wafer holding member WA1 (WA2) is configured to include the penetrating portion PEP that is opened on the wafer placement surface WAS and the second back surface WAB, and to fix the semiconductor wafer SW on the wafer placement surface WAS by causing the penetrating portion PEP to have a negative pressure state therein. In the second placement step, the wafer holding member WA1 (WA2) is placed on the measuring stage so that the penetrating portion PEP and the suction groove ADG are continuous with each other. Since flatness of the wafer placement surface WAS of the wafer holding member WA1 (WA2) is high, the thinned semiconductor wafer SW can be appropriately sucked in vacuum onto the wafer placement surface WAS.

In the test step, as shown in FIG. 3, a voltage is applied to the gate electrode, and it is determined whether the breakdown voltage of the gate oxide film has any problem or not. For example, a voltage of several tens of volts is applied to the gate. The collector electrode and the emitter electrode are at a ground potential GND. Only a chip without any problem is selected (non-defective chips and defective chips are separately selected). All chip sections are tested. When the wafer holding member WA1 (WA2) has the electrical conductivity, the semiconductor wafer SW can be tested on the wafer holding member WA1 (WA2), and therefore, it is unnecessary to use the test apparatus dedicated to the thinned wafer.

In accordance with a result of the test step, a step of changing the manufacturing process condition may be added. In this manner, the test result in the test step can be fed back to the manufacturing process condition. Also, in accordance with the result of the test step, a step of screening the non-defective chips and the defective chips may be added.

In the test step, the semiconductor wafer SW is tested by applying the voltage to the semiconductor wafer SW through the prober PRO of the test apparatus in contact with the surface of the semiconductor wafer SW and the electrical-conductive wafer holding member WA1 (WA2). The semiconductor wafer SW includes the plurality of cell regions (semiconductor chips SC) spaced apart from one another and the scribe region ARS formed between the plurality of cell regions (semiconductor chips SC). The penetrating portion PEP is formed to overlap the scribe region ARS in plan view, and the prober PRO in the test step is in contact with the cell region (semiconductor chip SC) not to overlap the penetrating portion PEP.

Next, the semiconductor wafer SW is moved in a state in which the semiconductor wafer SW is held on the wafer holding member WA1 (WA2) (see the cross-sectional view E of FIG. 1) (wafer movement step: step P08). The semiconductor wafer SW is cut into the small thickness portion SWB1 and the large thickness portion SWB2 (ring cut step: step P09). An annular dicing frame DF1 to which a dicing tape DT1 is previously pasted is prepared, and the semiconductor wafer SW is pasted on an upper surface of this dicing tape DT1 so that the upper surface SWS of the semiconductor wafer SW and the upper surface of the dicing tape DT1 face each other. Next, as shown in FIG. 24, an outer periphery of the small thickness portion SWB1 of the semiconductor wafer SW is cut into a ring shape (ring cut) along a boundary between the small thickness portion SWB1 and the large thickness portion SWB2 of the semiconductor wafer SW by using, for example, an extremely-thin dicing blade (circular blade) DB1 (or laser beam) on which diamond fine particles are pasted, and then, the large thickness portion SWB2 is removed. The ring cut step may be performed in a state in which the semiconductor wafer SW is placed on the wafer holding member WA1 (WA2) or not placed on the wafer holding member WA1 (WA2).

Sixth Embodiment

Figure 15:
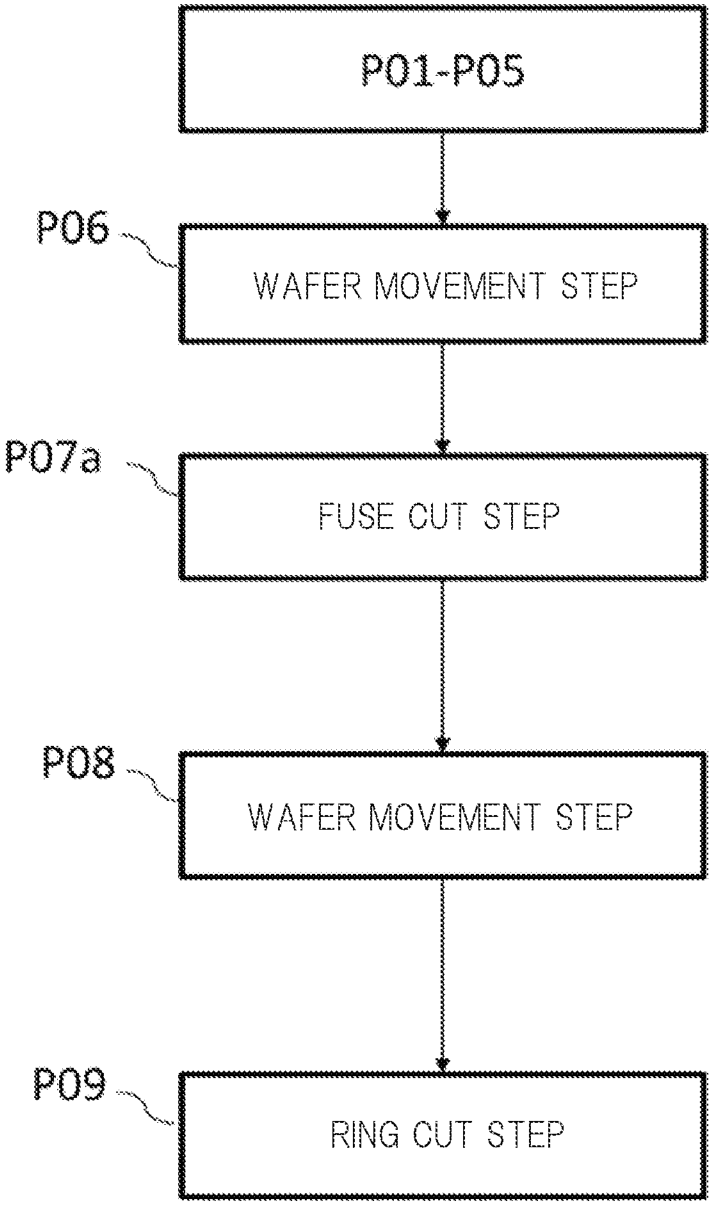
FIG. 15 is an explanatory flowchart of a method of manufacturing the semiconductor device according to a sixth example.

Next, with reference to FIG. 15, a method of manufacturing the semiconductor device according to a sixth embodiment will be explained. FIG. 15 is an explanatory flowchart of the method of manufacturing the semiconductor device according to the sixth embodiment. In the sixth embodiment, the "gate screening (test step): step P07" of the fifth embodiment is changed to a fuse cut step (step P07*a*). In the sixth embodiment, steps P01 to P05 and P08 to P09 are the same as the steps P01 to P05 and P08 to P09 of the fifth embodiment, and therefore, repetitive explanation for these steps will be omitted.

The fuse cut step (step P07*a*) is for adjusting a resistance of a fuse element by cutting, using laser beam, the fuse element formed in the region of the semiconductor chip SC of the semiconductor wafer SW. Of course, the fuse element can be an electric fuse cut by electric current. The fuse element is, for example, an element or a wiring made of polycrystal silicon.

As the intended use of the fuse element other than the resistance adjustment, traceability of the semiconductor chip SC is exemplified. In other words, the fuse element is used as a traceability ID or a chip ID of the semiconductor chip SC. Since the warpage problem of the thinned semiconductor wafer SW can be solved by the vacuum suction, the fuse element can be appropriately cut by the laser beam.

Seventh Embodiment

Figure 16:
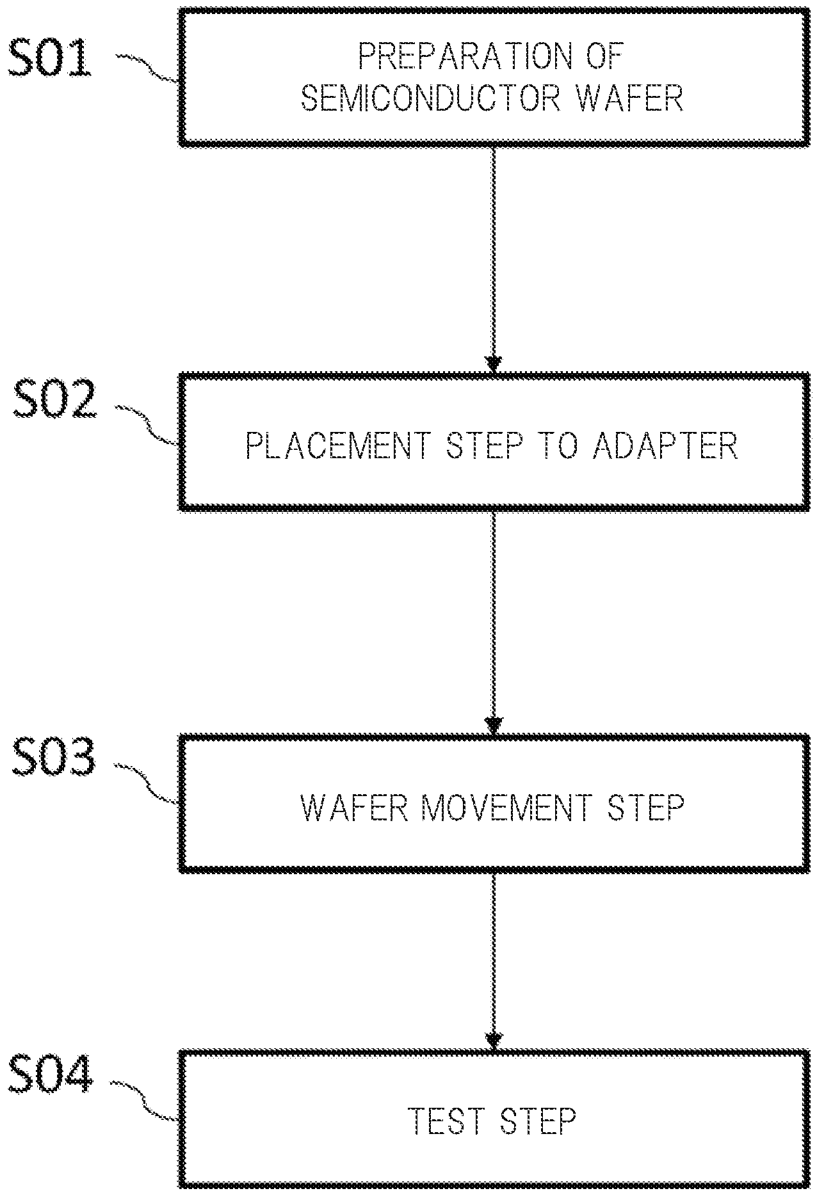
FIG. 16 is an explanatory flowchart of a method of testing the semiconductor device according to a seventh example.

Next, with reference to FIG. 16, a method of testing the semiconductor device according to a seventh embodiment will be explained. FIG. 16 is an explanatory flowchart of the method of testing the semiconductor device according to the seventh embodiment.

First, the semiconductor wafer on which the plurality of semiconductor devices (semiconductor chips) and the back surface electrode are formed is prepared (step of preparing the semiconductor wafer: step S01). This step S01 corresponds to the steps P01 to P04 of the fifth embodiment.

Next, the semiconductor wafer SW for the test is picked up from a production line, and the semiconductor wafer SW is placed on the wafer placement surface WAS of the wafer holding member WA1 (WA2) as shown in FIG. 23 (step of mounting on adapter: step S02).

Next, the wafer holding member WA1 (WA2) on which the semiconductor wafer SW for the test is mounted is moved (step of moving the semiconductor wafer: S03). The destination of the movement of the semiconductor wafer SW mounted on the wafer holding member WA1 (WA2) is, for example, the test stage of the electrical test apparatus such as a wafer test apparatus or an appearance test apparatus such as a microscope.

Next, the semiconductor wafer SW for the test is tested (test step: step S04). In this step, for example, the electrical test that is so-called wafer test is performed. In other words, in the test step, the semiconductor wafer SW is tested by applying the voltage to the semiconductor wafer SW through the first electrode (gate electrode) formed on the front surface SWS of the semiconductor chip SC, the second electrode (back surface electrode, collector electrode) formed on the back surface SWB of the semiconductor chip SC and the wafer holding member WA1 (WA2) in the state in which the semiconductor wafer SW is held on the wafer holding member WA1 (WA2) (see FIG. 3).

Alternatively, in the test step (step S04), a test for checking scratches, foreign substances or others is performed under microscopic observation (appearance test). The whole outer shape of the wafer holding member WA1 (WA2) on which the semiconductor wafer SW is mounted is almost the same as the shape of the related-art semiconductor wafer (the semiconductor wafer not using the TAIKO process: the semiconductor wafer without the small thickness portion SWB1), and therefore, a test apparatus not dedicated to the thinned semiconductor wafer SW (dedicated to TAIKO) can be also used for the test step.

In the foregoing, the invention made by the inventors of the present application has been concretely described on the basis of the embodiments. However, it is needless to say that the invention of the present disclosure is not limited to the foregoing embodiments and examples, and various modifications can be made within the scope of the invention of the present disclosure.

What is claimed is:

1. A method of manufacturing a semiconductor device comprising:

a grind step of forming a small thickness portion and a large thickness portion surrounding the small thickness portion by grinding a first back surface of a semiconductor wafer including a front surface and the first back surface opposite to the front surface;

a preparation step of preparing a wafer holding member including a wafer placement surface and a second back surface opposite to the wafer placement surface and having a larger thickness than a difference between a thickness of the large thickness portion and a thickness of the small thickness portion;

a first placement step of placing the semiconductor wafer on the wafer holding member so that the small thickness portion of the semiconductor wafer and the wafer placement surface of the wafer holding member are in contact with each other on a first back surface side of the semiconductor wafer;

a movement step of moving the semiconductor wafer in a state in which the semiconductor wafer is held on the wafer holding member; and a second placement step of placing the wafer holding member and the semiconductor wafer onto a measuring stage including a suction groove for vacuum suction formed thereon in a state in which the semiconductor wafer is placed on the wafer holding member, wherein the wafer holding member includes a penetrating portion opened on the wafer placement surface and the second back surface, wherein the semiconductor wafer placed on the wafer placement surface is fixed by causing the penetrating portion to have a negative pressure state, and wherein a second open width of the penetrating portion opened on the second back surface is larger than a first open width of the penetrating portion opened on the wafer placement surface.

2. The method of manufacturing the semiconductor device according to claim 1, wherein, in the placement step, the semiconductor wafer is placed on the wafer holding member so that the large thickness portion of the semiconductor wafer and the wafer holding member are not in contact with each other.

3. The method of manufacturing the semiconductor device according to claim 2, wherein the wafer holding member includes:

a stage having the wafer placement surface; and an outer periphery formed to surround the stage on the first back surface side in plan view, in the placement step, the semiconductor wafer is placed on the stage so that the large thickness portion of the semiconductor wafer and the outer periphery of the wafer holding member face each other.

4. The method of manufacturing the semiconductor device according to claim 3, wherein a first notch is formed in a part of the outer periphery, a second notch is formed in a part of the outer periphery of the semiconductor wafer, and, in the placement step, the semiconductor wafer is placed on the stage so that the first notch of the wafer holding member and the second notch of the semiconductor wafer overlap each other.

5. The method of manufacturing the semiconductor device according to claim 1, wherein, in the second placement step, the wafer holding member is placed on the measuring stage so that the penetrating portion and the suction groove communicate with each other.

6. The method of manufacturing the semiconductor device according to claim 1, wherein the penetrating portion includes a plurality of penetrating channels, and the plurality of penetrating channels are concentrically opened on the wafer placement surface in plan view.

7. The method of manufacturing the semiconductor device according to claim 1, further comprising a test step of testing the semiconductor wafer by applying a voltage to the semiconductor wafer through the wafer holding member, wherein the wafer holding member has an electrical conductivity.

8. The method of manufacturing the semiconductor device according to claim 7, further comprising a step of changing a manufacturing process condition in accordance with a result of the test step.

9. The method of manufacturing the semiconductor device according to claim 7, further comprising a screening step of screening a non-defective chip and a defective chip in accordance with a result of the test step.

10. The method of manufacturing the semiconductor device according to claim 1, further comprising a test step of testing the semiconductor wafer by applying a voltage to the semiconductor wafer through a prober being in contact with the front surface of the semiconductor wafer and the wafer holding member, wherein the wafer holding member has an electrical conductivity, the semiconductor wafer includes:

a plurality of cell regions spaced apart from each other; and a scribe region formed between the plurality of cell regions, the penetrating portion is formed to overlap the scribe region in plan view, and, in the test step, the prober is in contact with the cell region so as not to overlap the penetrating portion.

11. The method of manufacturing the semiconductor device according to claim 1, further comprising a step of cutting a fuse element formed on the semiconductor wafer by using laser beam.

* * * * *